(12) United States Patent
Sin et al.

(10) Patent No.: US 9,553,185 B2
(45) Date of Patent: Jan. 24, 2017

(54) MOS-DRIVEN SEMICONDUCTOR DEVICE AND METHOD FOR MANUFACTURING MOS-DRIVEN SEMICONDUCTOR DEVICE

(75) Inventors: Kin-On Sin, Kowloon (CN); Chun-Wai Ng, Kowloon (CN); Hitoshi Sumida, Matsumoto (JP); Yoshiaki Toyada, Matsumoto (JP); Akihiko Ohi, Nagano (JP); Hiroyuki Tanaka, Nagano (JP); Takeyoshi Nishimura, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 385 days.

(21) Appl. No.: 13/634,603

(22) PCT Filed: May 27, 2010

(86) PCT No.: PCT/JP2010/003579
§ 371 (c)(1),
(2), (4) Date: Sep. 19, 2012

(87) PCT Pub. No.: WO2011/148427
PCT Pub. Date: Dec. 1, 2011

(65) Prior Publication Data
US 2013/0001681 A1  Jan. 3, 2013

(51) Int. Cl.
*H01L 29/66* (2006.01)
*H01L 29/78* (2006.01)
(Continued)

(52) U.S. Cl.
CPC ....... *H01L 29/7813* (2013.01); *H01L 29/4236* (2013.01); *H01L 29/66734* (2013.01);
(Continued)

(58) Field of Classification Search
CPC ............ H01L 29/7813; H01L 29/4236; H01L 29/66734; H01L 29/0865; H01L 29/0869; H01L 21/26586
(Continued)

(56) References Cited

U.S. PATENT DOCUMENTS 5,086,007 A   2/1992 Ueno
5,298,780 A   3/1994 Harada
(Continued)

FOREIGN PATENT DOCUMENTS

JP   11-097685 A   4/1999
JP   11-103052 A   4/1999
(Continued)

OTHER PUBLICATIONS

International Search Report for PCT/JP2010/003579. Mail date Aug. 31, 2010.

*Primary Examiner* — Vongsavanh Sengdara
(74) *Attorney, Agent, or Firm* — Rossi, Kimms & McDowell LLP

(57) ABSTRACT

A mask used to form an $n^+$ source layer (11) is formed by a nitride film on the surface of a substrate before a trench (7) is formed. At this time, a sufficient width of the $n^+$ source layer (11) on the surface of the substrate is secured. Thereby, stable contact between the $n^+$ source layer (11) and a source electrode (15) is obtained. A CVD oxide film (12) that is an interlayer insulating film having a thickness of 0.1 micrometer or more and 0.3 micrometer or less is formed on doped poly-silicon to be used as a gate electrode (10a) embedded in the trench (7), and non-doped poly-silicon (13) that is not oxidized is formed on the CVD oxide film (12). Thereby, generation of void in the CVD oxide film (12) is suppressed and, by not oxidizing the non-doped poly-silicon (13), a semiconductor apparatus is easily manufactured.

3 Claims, 24 Drawing Sheets

(51) Int. Cl.
*H01L 29/423* (2006.01)
*H01L 21/265* (2006.01)
*H01L 29/08* (2006.01)

(52) U.S. Cl.
CPC .... *H01L 21/26586* (2013.01); *H01L 29/0865* (2013.01); *H01L 29/0869* (2013.01)

(58) Field of Classification Search
USPC .......................................................... 257/330
See application file for complete search history.

(56) References Cited

U.S. PATENT DOCUMENTS

| | | | |
|---|---|---|---|
| 6,274,437 B1 | 8/2001 | Evans | |
| 6,351,009 B1 | 2/2002 | Kocon et al. | |
| 6,376,314 B1 | 4/2002 | Jerred | |
| 6,818,946 B1 | 11/2004 | Venkatraman | |
| 7,344,943 B2 | 3/2008 | Herrick et al. | |
| 2002/0125529 A1 | 9/2002 | Zeng | |
| 2003/0089946 A1* | 5/2003 | Hshieh | H01L 21/28185 257/338 |
| 2007/0032020 A1 | 2/2007 | Grebs et al. | |
| 2008/0093665 A1 | 4/2008 | Takehara | |
| 2008/0135921 A1* | 6/2008 | Murase | H01L 29/7813 257/324 |
| 2008/0258239 A1* | 10/2008 | Ishiguro | H01L 29/66712 257/397 |
| 2009/0014788 A1 | 1/2009 | Okumura et al. | |
| 2009/0111231 A1 | 4/2009 | Grebs et al. | |
| 2010/0072543 A1* | 3/2010 | Hsieh | H01L 29/4925 257/331 |
| 2011/0127602 A1* | 6/2011 | Mallikarjunaswamy | H01L 21/823807 257/331 |

FOREIGN PATENT DOCUMENTS

| | | |
|---|---|---|
| JP | 2005-116649 A | 4/2005 |
| JP | 2008-108785 A | 5/2008 |
| JP | 2009-500831 A | 1/2009 |
| WO | 02/078092 A1 | 10/2002 |
| WO | 2006/126998 A1 | 11/2006 |

* cited by examiner

MOS-DRIVEN SEMICONDUCTOR DEVICE AND METHOD FOR MANUFACTURING MOS-DRIVEN SEMICONDUCTOR DEVICE

This application is a U.S. National Phase Application of PCT International Application PCT/JP2010/003579 filed on May 27, 2010.

TECHNICAL FIELD

The present invention relates to a MOS-driven semiconductor device and to a method for manufacturing MOS-driven semiconductor device.

BACKGROUND ART

Recently, concerning low voltage class power MOSFETs of 100 V or less, development of a power MOSFET having a trench gate (hereinafter, "power MOSFET") is actively pursued aiming at reducing ON-resistance by reducing channel resistance. Various structures have been proposed for such a power MOSFET.

FIG. 21 is a cross-sectional view of components of a conventional power MOSFET. The power MOSFET includes an $n^-$ epitaxial layer (hereinafter, "$n^-$ epi layer") 52 that is disposed on an $n^+$ drain layer 51 and that is an $n^-$ drift layer; a p-channel layer (p-base layer) 53 that is disposed on a surface layer of the $n^-$ epi layer 52; an $n^+$ source layer 61 and a $p^+$ contact layer 64 that are disposed in a surface layer of the p-channel layer 53; a trench 57 that passes through the $n^+$ source layer 61 and the p-channel layer 53 to the $n^-$ epi layer 52; a gate oxide film 59 that is disposed along an inner wall of the trench 57; a gate electrode 60a that is made of doped poly-silicon and that is embedded in the trench 57 through the gate oxide film 59; an interlayer insulating film 62a that is disposed on the gate electrode 60a and that fills an upper portion of the trench 57; a source electrode 65 that is disposed spanning across the $n^+$ source layer 61, the $p^+$ contact layer 64, and the interlayer insulating film 62a; and a drain electrode 66 that is disposed on a back face of the $n^+$ drain layer 51 (see, e.g., Patent Literature 1 below).

A manufacturing method of the power MOSFET depicted in FIG. 21 will be described. After the p-channel layer 53 is formed, the trench 57 that passes from the p-channel layer 53 to the $n^-$ epi layer 52 is formed. The trench 57 is formed by dry etching using an oxide film (hereinafter, "CVD oxide film") formed by chemical vapor deposition (CVD), as a mask. The gate oxide film 59 is formed in the trench 57 and the trench 57 is filled with poly-silicon forming the gate electrode 60a. The position of a surface of the gate electrode 60a is lower than a surface of the p-channel layer 53, a principal surface of the substrate. To form the $n^+$ source layer 61, arsenic (As) ion is obliquely ion-implanted from a side wall of the trench 57 to the p-channel layer 53 using, as a mask, the CVD oxide film that is used to form the gate electrode 60a and the trench 57. Therefore, a diffusion source that forms the $n^+$ source layer 61 is introduced into the side wall of the trench 57. The CVD oxide film is removed. A resist mask that has an opening corresponding to an area to form the $p^+$ contact layer 64 is formed. Using this resist mask, boron (B) ion or boron fluoride ($BF_2$) ion is implanted into a surface of the p-channel layer 53.

The impurity ion introduced into the surface of the p-channel layer 53 is activated by a heat treatment and thereby, the $n^+$ source layer 61 and the $p^+$ contact layer 64 are formed. The $n^+$ source layer 61 is formed by a diffusion of arsenic having a short diffusion length diffused from the side wall of the trench 57. Therefore, the width (hereinafter, meaning a "lateral diffusion width") w of a surface of the $n^+$ source layer 61 that is exposed to the surface of the p-channel layer 53 becomes narrow. The interlayer insulating film 62a made of Boron Phosphor Silicate Glass (BPSG), etc., is deposited. The interlayer insulating film 62a is etched to the surface of the p-channel layer 53, the principal surface of the substrate. The source electrode 65 in contact with the $n^+$ source layer 61 is formed using a metal such as aluminum (Al). The drain electrode 66 is formed on the posterior surface of the $n^+$ drain layer 51 using a metal such as gold (Au).

A feature of the above manufacturing method is that the $n^+$ source layer 61 is formed by self-alignment using the mask that is used to form the gate electrode 60a and the trench 57. As a result, effects described in (1) to (3) herein are obtained. (1) In forming the $n^+$ source layer 61, any shift of the mask made during the patterning, any tolerance for etching back the gate electrode 60a, etc., do not need to be taken into account. (2) A cell may be downsized because the lateral diffusion width of the $n^+$ source layer 61 can be reduced. (3) Because the $n^+$ source layer 61 is formed using the gate electrode 60a as a mask, an overlapped portion of the gate and the source regions can be reduced and therefore, source-gate parasitic capacity can be reduced.

A method of forming an L-shaped source region by obliquely implanting ion using a resist mask having a narrower width than that of a mask for forming a trench has been proposed as another manufacturing method of a power MOSFET. The ion is implanted into the inside of the trench using a gate electrode as a mask. Therefore, a same effect as that in (3) above is obtained (see, e.g., Patent Literature 2 below).

A method of filling a recess on a gate electrode with a CVD oxide film and poly-silicon (to be oxidized) aiming at securely and stably obtaining a gate electrode layer and a cap insulating layer each having a predetermined thickness has been proposed as another method (see, e.g., Patent Literature 3 below).

A method of forming an $n^+$ source layer by diffusing an impurity into an interlayer insulating film (Inter Layer Dielectrics (ILD)) has been proposed as another method. According to this method, the $n^+$ source layer may be formed evenly along the direction of the thickness of a trench groove. The width of the $n^+$ source layer along the direction of the trench width may be reduced. As a result, reduction of ON-resistance and finer processing can be facilitated (see, e.g., Patent Literature 4 to 6 below).

For electrical contact of a p-channel layer for which trench intervals are finely narrowed, a method of newly forming a trench to cross a gate trench, thereby, bringing a p-channel layer in electrical contact with a source electrode has been proposed as another method (see, e.g., Patent Literature 7 below).

A method of providing a contact of an $n^+$ source layer also for a side wall of a trench has been proposed as another method. According to this method, the contact of the $n^+$ source layer in the device surface portion does not affect contact resistance and therefore, the width of the $n^+$ source layer along the direction of the trench width may be narrow. Therefore, finer processing is enabled (see, e.g., Patent Literature 8 below).

A method of forming a gate region in a two-stage trench to narrow the width of a unit cell that includes a source region and a gate region, aimed at reducing "Ron*A (ON-resistance per unit area)" has been proposed as another method (see, e.g., Patent Literature 9 and 10 below).

A method of forming a p-channel layer after forming a trench has been proposed as another method. According to this method, doping to form the p-channel layer is executed from a side wall of the trench. Thereby, control in forming the p-channel layer with respect to a trench gate electrode portion is improved (see, e.g., Patent Literature 11 below).

A semiconductor apparatus whose insulating layer under a gate electrode embedded in a trench is configured by a multi-layer insulating layer, aiming at reducing gate-drain capacity, has been proposed in, for example, Patent Literature 12 below.

A method of forming an $n^+$ source layer similar to the method recited in Patent Literature 1 above is also proposed in, for example, Patent Literature 13 below. A semiconductor apparatus having a substantially identical structure as the semiconductor apparatus proposed in Patent Literature 2 above is also proposed in Patent Literature 3 to 13 above.

CITATION LIST

Patent Literature

[PTL 1]
Japanese Patent Application Laid-Open Publication No. H11-97685
[PTL 2]
Japanese Patent No. 3281847, Paragraph Nos. 0017 and 0018 and FIGS. 5 and 6
[PTL 3]
US Patent No. 2008/093665
[PTL 4]
U.S. Pat. No. 5,086,007
[PTL 5]
U.S. Pat. No. 5,298,780
[PTL 6]
U.S. Pat. No. 6,351,009
[PTL 7]
US Patent No. 2009/014788
[PTL 8]
U.S. Pat. No. 6,818,946
[PTL 9]
U.S. Pat. No. 7,344,943
[PTL 10]
International Patent Publication No. 2006/126998
[PTL 11]
U.S. Pat. No. 6,376,314
[PTL 12]
International Patent Publication No. 2002/078092
[PTL 13]
U.S. Pat. No. 6,274,437

SUMMARY OF INVENTION

Technical Problem

However, according to the technique described in above Patent Literature 1, the ion implantation of arsenic to form the $n^+$ source layer 61 is executed for the p-channel layer 53 from the side wall of the trench 57 using the mask used to form the trench 57. The mask that is used to form the trench 57 covers an entire surface of the p-channel layer 53 sandwiched by the trenches 57. Therefore, to sufficiently secure the lateral diffusion width of the $n^+$ source layer 61 is difficult. As a result, to stably obtain the electrical contact between the $n^+$ source layer 61 and the source electrode 65 is difficult.

When the trench 57 is completely filled by filling the trench 57 with the CVD oxide film on the gate electrode 60a in the trench 57, the following problem arises. FIG. 22 is a cross-sectional view of a void generated in the interlayer insulating film. The rate of development of the CVD oxide film in the trench 57 differs from the rate on the substrate surface. Therefore, as depicted in FIG. 22, a void 67 tends to be generated in the interlayer insulating film 62a on the gate electrode 60a, arising in a problem of controlling the generation of the void 67.

According to the technique described in Patent Literature 1 above, a method of filling the inside of the trench 57 with BPSG to be used as the interlayer insulating film 62a is proposed. However, heat treatment at 850 degrees C. or higher for about 30 minutes is necessary to improve the reflow property of BPSG. Therefore, the diffusion profile of the $n^+$ source layer 61, etc., may vary due to the heat treatment. Additionally executing the heat treatment is accompanied by an increase of the lateral diffusion width of the diffusion layer, such as the $n^+$ source layer 61. Therefore, the technique is not preferable for finer processing of a device.

The following methods have been proposed as methods of solving the above problems. For example, in Patent Literature 2 above, a method of forming the $n^+$ source layer using a resist mask that is narrower than each interval between adjacent trenches after forming the trenches is proposed as a method to cause the $n^+$ source layer to be stably in electrical contact with the source electrode. However, according to this method, halation affects formation due to a gap formed in an upper portion of each trench during the process of patterning the resist. As a result, the patterned shape of the resist is deformed. Therefore, a problem arises in that the processing precision is degraded. The influence of the halation becomes stronger as each trench interval becomes narrower.

In Patent Literature 3 above, a method of facilitating insulation by forming a non-doped poly-silicon layer through a non-doped silicate glass (NSG) film or a high temperature oxide (HTO) film that is deposited on the gate poly-silicon, and oxidizing the non-doped poly-silicon layer is proposed as a method of controlling the generation of the void. However, a problem arises in that the diffusion profile of the diffusion layer such as the $n^+$ source layer is varied similarly to that in the above application of the BPSG by the heat treatment executed when the non-doped poly-silicon layer is oxidized.

As described, to manufacture the power MOSFET depicted in FIG. 21, solving the following two problems is necessary. (1) To be able to cause the $n^+$ source layer and the source electrode to be stably in electrical contact with each other on the substrate surface. (2) To form the interlayer insulating layer without generating a void in the upper portion of the gate poly-silicon in the trench and without adversely affecting the profile of the diffusion layer such as the $n^+$ source layer. None of these problems or any means of solving them are recited in the techniques described in Patent Literatures 1 to 13. Furthermore, Patent Literatures 1 to 13 include no content that suggests a means of solving the problems.

To solve the problems associated with the above conventional techniques, an object of the present invention is to provide a MOS-driven semiconductor device that is capable of reliably obtaining electrical contact between a source layer and a source electrode on a surface of a substrate, and a manufacturing method thereof. Another object of the present invention is to provide a MOS-driven semiconductor device that is capable of controlling the generation of a void, and a manufacturing method thereof. Another object of the present invention is to provide a MOS-driven semiconductor device that does not adversely affect the profile of a diffusion layer, and a manufacturing method thereof. Another object of the present invention is to provide a method for manufacturing a MOS-driven semiconductor device that is capable of reliably obtaining electrical contact between a source layer and a source electrode on a surface of a substrate, and to provide a method for manufacturing a MOS-driven semiconductor device that is capable of controlling the generation of a void.

Solution to Problem

To solve the above problems and achieve an object, a MOS-driven semiconductor device according to the invention of claim 1 includes a channel layer of a second conducting type that is disposed in a surface layer of a first semiconductor layer of a first-conducting type; a trench that passes through the channel layer to the first semiconductor layer; a second semiconductor layer that is of the first conducting type, is in contact with a side wall of the trench, and selectively disposed in a surface layer of the channel layer; a third semiconductor layer that is of the second conducting type, is disposed in the surface layer of the channel layer, and has an impurity concentration that is higher than that of the channel layer and lower than that of the second semiconductor layer; a gate insulating film that is disposed on an inner wall of the trench; a gate electrode that is embedded in the trench through the gate insulating film, a height of a surface of the gate electrode being along a side face of the second semiconductor layer; an oxide film that is disposed on the gate electrode and on the side wall of the trench, the oxide film being made of an LP-TEOS film or an HTO film; a non-doped poly-silicon layer that is disposed on the oxide film; and a main electrode that is in contact with the second semiconductor layer and the third semiconductor layer.

A manufacturing method of a MOS-driven semiconductor device according to the invention of claim 2 includes a step of selectively forming a channel layer of a second conducting type in a surface layer of a first semiconductor layer of a first conducting type; followed by a step of selectively forming a nitride film on a surface of the channel layer; and a step of forming a first mask on the nitride film and an exposed face of the channel layer, the first mask being used to form a trench. Subsequently, a step of forming the trench that passes through the channel layer to the first semiconductor layer, using the first mask; a step of removing the first mask to expose the nitride film; and a step of forming a gate insulating film on an inner wall of the trench are performed. Next, a step of embedding a gate electrode in the trench through the gate insulating film such that a height of a surface of the gate electrode is along a side face of the channel layer; a step of ion-implanting, in a surface layer of the channel layer and using the gate electrode and the nitride film as a second mask, an impurity of the first conducting type to form a second semiconductor layer that is of the first conducting type and has an L-shape; and a step of removing the nitride film, and forming an oxide film that is made of an LP-TEOS film or an HTO film, such that a recess remains at an upper portion of the trench, the recess being above the gate electrode and extending to side walls of the trench are performed. Next, a step of forming a non-doped poly-silicon layer on the gate electrode to fill the recess through the oxide film; a step of ion-implanting into the surface of the channel layer, an impurity of the second conducting type to form a third semiconductor layer that is of the second conducting type and has an impurity concentration that is higher than that of the channel layer and that is lower than that of the second semiconductor layer; a step of activating, by annealing, the ion-implanted impurities of the first and the second conducting types; and a step of forming a main electrode that is in contact with the second semiconductor layer and the third semiconductor layer are performed.

In the manufacturing method of a MOS-driven semiconductor device according to the invention of claim 3 and based on the invention of claim 2, a thickness of the oxide film is 0.1 um or more and 0.3 um or less.

In the manufacturing method of a MOS-driven semiconductor device according to the invention of claim 4 and based on the invention of claim 2, an interval of the trench is 0.2 micrometer or more and 0.8 micrometer or less.

In the manufacturing method of a MOS-driven semiconductor device according to the invention of claim 5 and based on the invention of claim 2, a heat treatment process to oxidize and insulate the non-doped poly-silicon layer is not performed.

A manufacturing method of a MOS-driven semiconductor device according to the invention of claim 6 includes a step of selectively forming a channel layer of a second conducting type in a surface layer of a first semiconductor layer of a first conducting type; followed by a step of forming a first mask on a surface of the channel layer, the first mask being used to form a trench; and a step of forming the trench that passes through the channel layer to the first semiconductor layer, using the first mask. Subsequently, a step of forming a gate insulating film on an inner wall of the trench; a step of embedding a gate electrode in the trench through the gate insulating film such that a height of a surface of the gate electrode is along a side face of the channel layer; and a step of ion-implanting, in a side wall of the trench and using at least the gate electrode as a second mask, an impurity of the first conducting type to form a second semiconductor layer that is of the first conducting type are performed. Next, a step of forming an oxide film that is made of an LP-TEOS film or an HTO film, such that a recess remains at an upper portion of the trench, the recess being above the gate electrode and extending to side walls of the trench; a step of filling the recess and forming a non-doped poly-silicon layer on the gate electrode through the oxide film; and a step of ion-implanting into the surface of the channel layer, an impurity of the second conducting type to form a third semiconductor layer that is of the second conducting type and has an impurity concentration that is higher than that of the channel layer and that is lower than that of the second semiconductor layer are performed. Next, a step of activating, by annealing, the ion-implanted impurities of the first and the second conducting types; and a step of forming a main electrode that is in contact with the second semiconductor layer and the third semiconductor layer are performed, where a heat treatment process to oxidize and insulate the non-doped poly-silicon layer is not performed.

In the manufacturing method of a MOS-driven semiconductor device according to the invention of claim 7 and based on the invention of claim 6, a thickness of the oxide film is 0.1 micrometer or more and 0.3 micrometer or less.

A manufacturing method of a MOS-driven semiconductor device according to the invention of claim 8 includes a step of selectively forming a channel layer of a second conducting type in a surface layer of a first semiconductor layer of a first conducting type; followed by a step of selectively forming a nitride film on a surface of the channel layer; a step of forming a first mask on the nitride film and an exposed face of the channel layer, the first mask being used to form a trench; and a step of forming the trench that passes through the channel layer to the first semiconductor layer, using the first mask. Subsequently, a step of removing the first mask to expose the nitride film; a step of forming a gate insulating film on an inner wall of the trench; a step of embedding a gate electrode in the trench through the gate insulating film such that a height of a surface of the gate electrode is along a side face of the channel layer; and a step of ion-implanting, in a surface layer of the channel layer and using the gate electrode and the nitride film as a second mask, an impurity of the first conducting type to form a second semiconductor layer that is of the first conducting type and has an L-shape are performed. Next, a step of removing the nitride film, and forming an insulation film on the gate electrode; a step of forming a non-doped poly-silicon layer on the gate electrode to fill up the recess through the oxide film; and a step of ion-implanting into the surface of the channel layer an impurity of the second conducting type to form a third semiconductor layer that is of the second conducting type and has an impurity concentration that is higher than that of the channel layer and that is lower than that of the second semiconductor layer are performed. Next, a step of activating, by annealing, the ion-implanted impurities of the first and the second conducting types; and a step of forming a main electrode that is in contact with the second semiconductor layer and the third semiconductor layer are performed.

In the manufacturing method of a MOS-driven semiconductor device according to the invention of claim 9 and based on the invention of claim 8, the forming the insulation film on the gate electrode includes: forming an oxide film being made of an LP-TEOS film or an HTO film such that a recess remains at an upper portion of the trench, the recess being above the gate electrode and extending to side walls of the trench; forming a non-doped poly-silicon layer on the gate electrode to fill up the recess through the oxide film; and a heat treatment process to oxidize and insulate the non-doped poly-silicon layer.

In the manufacturing method of a MOS-driven semiconductor device according to the invention of claim 10 and based on the invention of claim 8, an interval of the trench is 0.2 micrometer or more and 0.8 micrometer or less.

According to the above invention, the second mask to form the second semiconductor layer is formed using the nitride film before forming the trench. Consequently, the second mask can be easily formed. Further, by forming the second mask prior to forming the trench, generation of irregularity in the mask pattern width of the nitride film is prevented. By using the nitride film, even after the formation of the trench, the film can be left as mask material. Whereby, the second semiconductor layer is formed assuredly on the flat surface of the channel layer. Therefore, the second semiconductor layer and the main electrode are caused to be stably in electrical contact with each other on the substrate surface. In particular, the above invention is effective for a MOS-driven semiconductor device that employs fine cells whose adjacent trench interval is 0.8 micrometer or less. The recess surrounded by the surface of the gate electrode formed in the trench and the side wall of the trench is covered by the oxide film having a thickness of 0.1 micrometer or more to leave the recess uncovered, and the recess is filled with the non-doped poly-silicon layer. The upper portion of the trench is not completely filled with the oxide film and therefore, generation of a void in the oxide film is controlled. The breakdown voltage between the gate and the source may be secured by forming the oxide film to have a thickness of 0.1 micrometer or more. Therefore, any heat treatment to insulate the non-doped poly-silicon layer is unnecessary. By not executing heat treatment, variation of the diffusion profile of the diffusion layer, such as the second semiconductor layer, is prevented.

Advantageous Effects of Invention

According to the manufacturing method of a semiconductor apparatus of the present invention, an effect is achieved in that a source layer and a source electrode are caused to be stably in electrical contact with each other on a surface of the substrate. Another effect is achieved in that generation of a void is controlled. Another effect is achieved in that the profile of a diffusion layer is not adversely affected.

DESCRIPTION OF EMBODIMENTS

Figure 1:
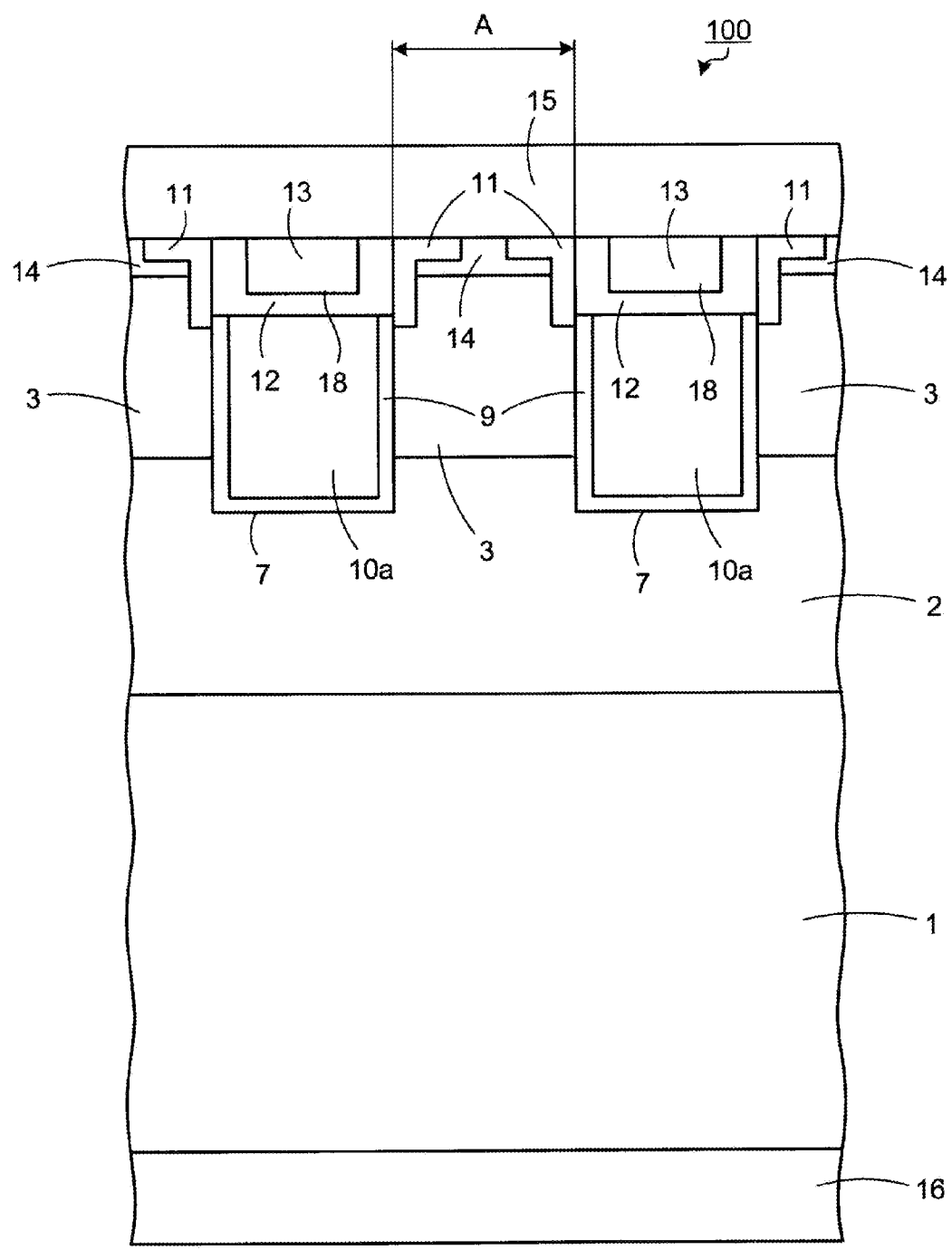
FIG. 1 is a cross-sectional view of components of a MOS-driven semiconductor device according to a first embodiment of the present invention.

Preferred embodiments of a manufacturing method of a semiconductor device according to the present invention will be described in detail with reference to the accompanying drawings. In the following description of the embodiments and the accompanying drawings, identical structures are given identical reference numerals and redundant description is omitted. "+" and "−" that are superscripts for "n" and "p" respectively mean that a layer or an area with "+" or "−" has a higher impurity concentration or a lower impurity concentration than that of a layer or an area without a superscript. A first conducting type will be described as n type and a second conducting type will be described as p type.

In the present invention, a poly-silicon layer that is formed being doped with an impurity source during deposition is referred to as a doped poly-silicon layer, and a poly-silicon layer that is formed being not doped with any impurity source during deposition is referred to as a non-doped poly-silicon layer. A non-doped poly-silicon layer that is doped with an impurity source after deposition is also referred to as a non-doped poly-silicon layer.

(First Embodiment)

FIG. 1 is a cross-sectional view of components of a MOS-driven semiconductor device according to a first embodiment of the present invention. As depicted in FIG. 1, a power MOSFET 100 of the present invention includes an n− epitaxial layer (hereinafter, "n− epi layer") 2 that is disposed on an n+ semiconductor substrate 1; a p-channel layer 3 that is disposed on the n− epi layer 2; trenches 7 that pass through the p-channel layer 3 to the n− epi layer 2; n+ source layers 11 that are selectively disposed in surface layers of a side face and a top face of the p-channel layer 3; and p+ contact layers 14 that are disposed in a surface layer of the p-channel layer 3.

The n+ semiconductor substrate 1 is an n+ drain layer. The n+− epi layer 2 is an n− drift layer. The n− epi layer 2 corresponds to the first semiconductor layer. The p-channel layer 3 is a p-base layer. Preferably, each interval between adjacent trenches 7 (hereinafter, "trench interval A" in FIG. 1) is 0.2 micrometer or wider and 0.8 micrometer or narrower. The reason for this will be described later. The n+ source layers 11 each have an L-shape that is disposed spanning from the top face of the p-channel layer 3 to the surface layer of a side face thereof. Each of the n+ source layers 11 corresponds to the second semiconductor layer.

The p+ contact layers 14 each have an impurity concentration that is higher than that of the p-channel layer 3 and that is lower than that of the n+ source layers 11. The p+ contact layers 14 cover a lower area of the n+ source layers 11 that are selectively disposed in the surface layer in the top surface of the p-channel layer 3. The lower area of the n+ source layers 11 is an area on the n+ semiconductor substrate 1 side of the n+ source layers 11. Each of the p+ contact layers 14 corresponds to a third semiconductor layer.

The power MOSFET 100 further includes gate insulating films (gate oxide films) 9 that are disposed on the inner wall of the trenches 7, respectively; gate electrodes 10a that are embedded in the trenches 7 through the gate insulating films 9; oxide films (CVD oxide films) 12 that are formed using a CVD method to be disposed on the gate electrode 10a and on the side wall of each of the trenches 7, and having a half-square-pipe shape; non-doped poly-silicon layers 13 that are disposed on of the CVD oxide films 12, respectively and that are not oxidized; a source electrode 15 that is disposed spanning across the n+ source layers 11, the p+ contact layers 14, and the non-doped poly-silicon layers 13; and a drain electrode 16 that is disposed on a back face of the n+ semiconductor substrate 1 that is the n+ drain layer. The source electrode 15 corresponds to the main electrode.

Each boundary between the gate electrodes 10a and the CVD oxide films 12 is at a position that is closer to the n+ semiconductor substrate 1 than each boundary between the n+ source layers 11 and the source electrode 15. Each boundary between the gate electrodes 10a and the CVD oxide films 12 is also positioned between a lower area of the n+ source layers 11 disposed on the side wall of the p-channel layer 3 and the surface of the n+ source layers 11. In a vicinity of the surface of each of the gate electrodes 10a, the gate electrodes 10a and the n+ source layers 11 respectively disposed on a side wall of the p-channel layer 3 are adjacent to each other across each of the gate insulating films 9.

The CVD oxide films 12 form a recess 18 at an upper portion of each of the trenches 7. The CVD oxide films 12 are made of Low Pressure TetraEthOxySilane (LP-TEOS) films or HTO films. Preferably, the thickness of the CVD oxide films is 0.1 micrometer or more and 0.3 micrometer or less. The reason for this is as follows. A breakdown voltage of 60 V can be secured between the gate and the source by setting the film thickness of the CVD oxide films 12 to be 0.1 micrometer or more. Generation of a void in the CVD oxide films 12 can be prevented by setting the thickness of the CVD oxide films 12 to be 0.3 micrometer or less.

The non-doped poly-silicon layers 13 are disposed in the recesses 18 that are formed on the CVD oxide films 12 in the trenches 7, to fill gaps formed by the recesses 18 and the surfaces of the n+ source layers 11. Thereby, a void that is generated in the source electrode 15 by the gaps (the recesses 18) formed by the CVD oxide films 12 is suppressed. By suppressing this void, the bonding strength of wire bonded to the source electrode 15 may be prevented from getting weak. An increase in the resistance of the source electrode 15 caused by a void may be prevented.
(Second Embodiment)

FIGS. 2 to 15 are cross-sectional views of a MOS-driven semiconductor device, depicting a manufacturing method according to a second embodiment of the present invention. In FIGS. 2 to 15, the manufacturing method is depicted in order of processes. The manufacturing method of the MOS-driven semiconductor device depicted in FIG. 1 will be described herein using an n-channel MOSFET assuming the first conducting type to be n type.

Figure 2:
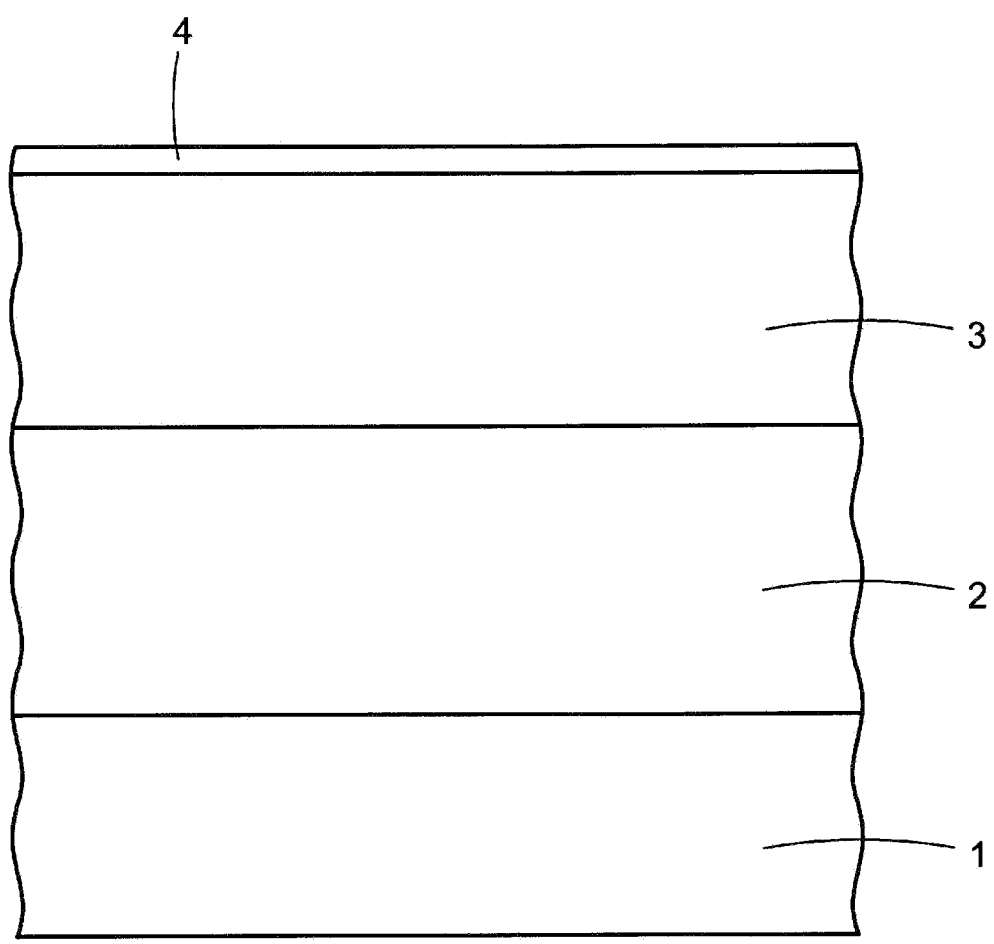
FIG. 2 is a cross-sectional view of a MOS-driven semiconductor device, depicting a manufacturing method according to a second embodiment of the present invention.

An $n^-$ epitaxial layer ($n^-$ epi layer) 2 having a resistivity of, for example, 1.0 Ohm*cm or less is formed on an $n^+$ semiconductor substrate 1 to be used as a drain layer. The $n^-$ epi layer 2 may be formed after forming on the $n^+$ semiconductor substrate 1, an $n^+$ buffer layer having a higher impurity concentration than that of the $n^+$ semiconductor substrate 1. In an activated portion of the power MOSFET, an impurity is introduced from the surface of the $n^-$ epi layer 2 and is diffused, thereby a p-channel layer 3 is formed. At this time, the p-channel layer 3 is formed such that the diffusion depth of the p-channel layer 3 is about 1.4 micrometer. The p-channel layer 3 is not formed in a guard ring portion (not depicted) that is a breakdown voltage structure portion of the power MOSFET. The thickness and the impurity concentration of the $n^-$ epi layer 2 and the diffusion profile of the p-channel layer 3 are set according to the specification of the breakdown voltage and the ON-resistance of a device. A buffer oxide film 4 having a thickness of several 10 nm is formed on the entire surface of the $n^-$ epi layer 2 (FIG. 2). The buffer oxide film 4 has a function of preventing the silicon surface such as that of the p-channel layer 3 from becoming rough at etching to pattern a nitride film formed on the surface of the buffer oxide film 4 at processes executed later.

Figure 3:
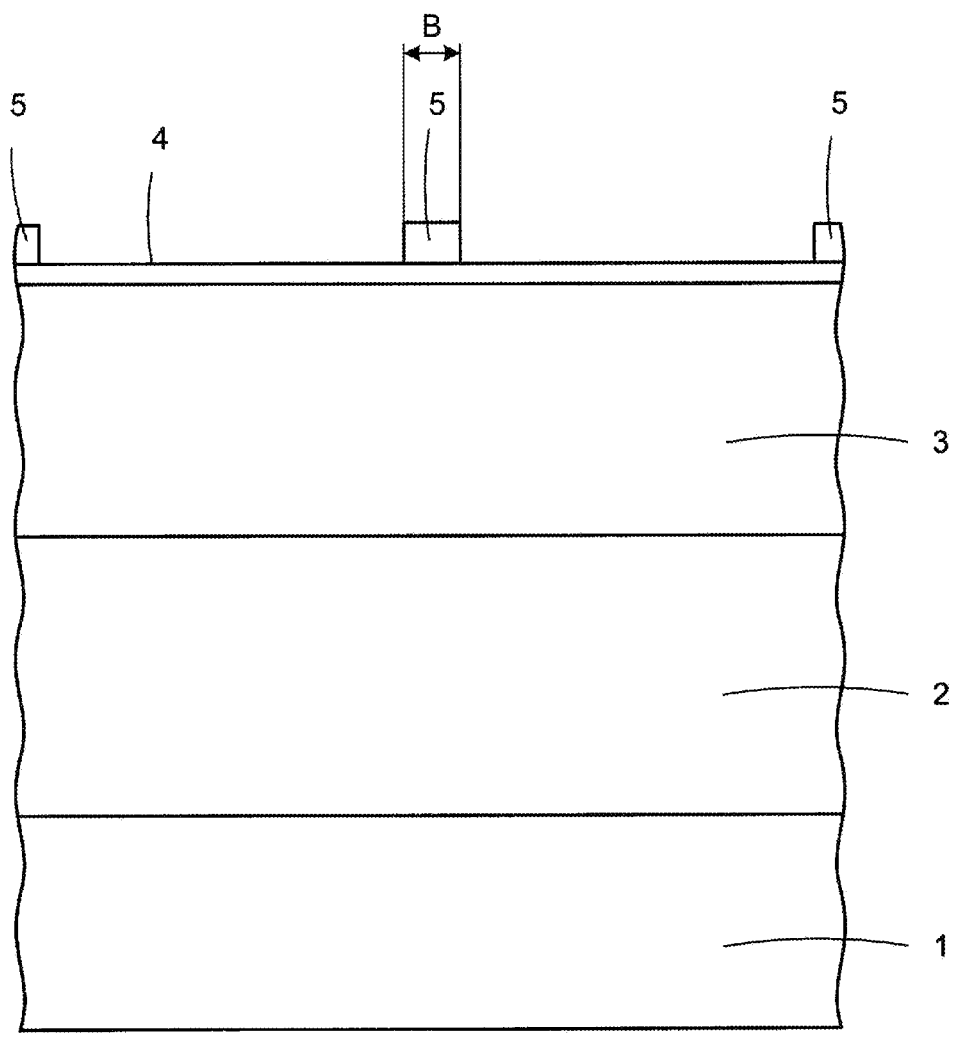
FIG. 3 is a cross-sectional view of a MOS-driven semiconductor device, depicting a manufacturing method according to the second embodiment of the present invention.
Figure 4:
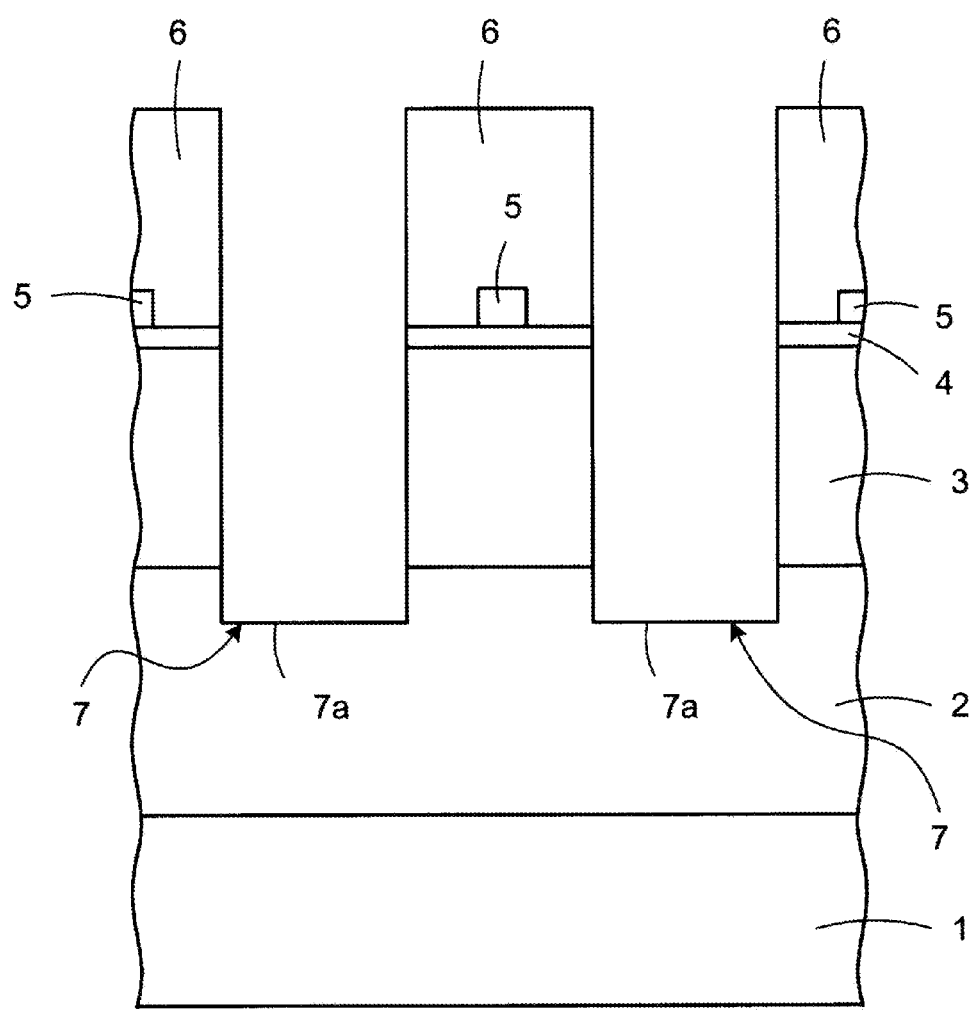
FIG. 4 is a cross-sectional view of a MOS-driven semiconductor device, depicting a manufacturing method according to the second embodiment of the present invention.

A nitride film 5 is deposited on the surface of the p-channel layer 3 through the buffer oxide film 4. The nitride film 5 is selectively etched using, for example, photo-resist, not depicted, as a mask and thereby, is patterned. Thereby, the nitride film 5 remains on the portions that are formed with $p^+$ contact layers (FIG. 3). Photo-resist 6 is applied and patterning of the photo-resist 6 is executed to form openings therein on the areas to form trenches. Trenches 7 are formed by dry etching using the photo-resist 6 as a mask. Trench bottom portions 7a pass through the p-channel layer 3 to the $n^-$ epi layer 2 (FIG. 4). The photo-resist 6 corresponds to a first mask.

The width of each of the trenches 7 may be, for example, 1.0 micrometer or less. Preferably, each trench interval A is, for example, 0.2 micrometer or more and 0.8 micrometer or less. The reason for this is that, when each interval of the trenches is less than 0.2 micrometer, each of the intervals between the nitride film 5 that is patterned and an end of an opening of each of the trenches 7 (the width of the surface of the $n^+$ source layer) is not secured to be sufficiently large and therefore, electrical contact between the $n^+$ source layers 11 and a source electrode 15 becomes incomplete. The reason for each interval of the trenches to be 0.8 micrometer or less will be described later. The mask pattern width B in FIG. 3 is, for example, 0.1 micrometer or more and 0.7 micrometer or less. Here, the reason the patterned nitride film 5 is formed before formation of the trenches 7 is, if the patterned nitride film 5 is formed after formation of the trenches, the nitride film 5 is formed in the trenches also and complete removal of the nitride film 5 remaining in the trenches 7 is difficult.

Figure 5:
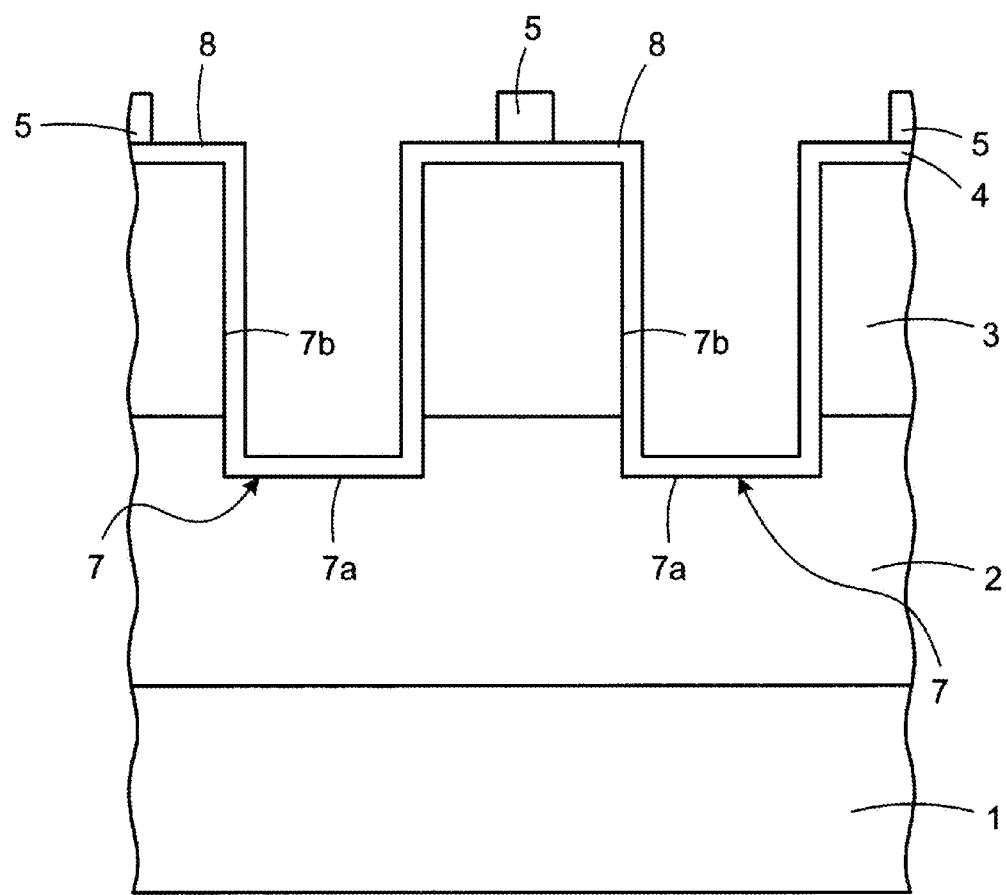
FIG. 5 is a cross-sectional view of a MOS-driven semiconductor device, depicting a manufacturing method according to the second embodiment of the present invention.
Figure 6:
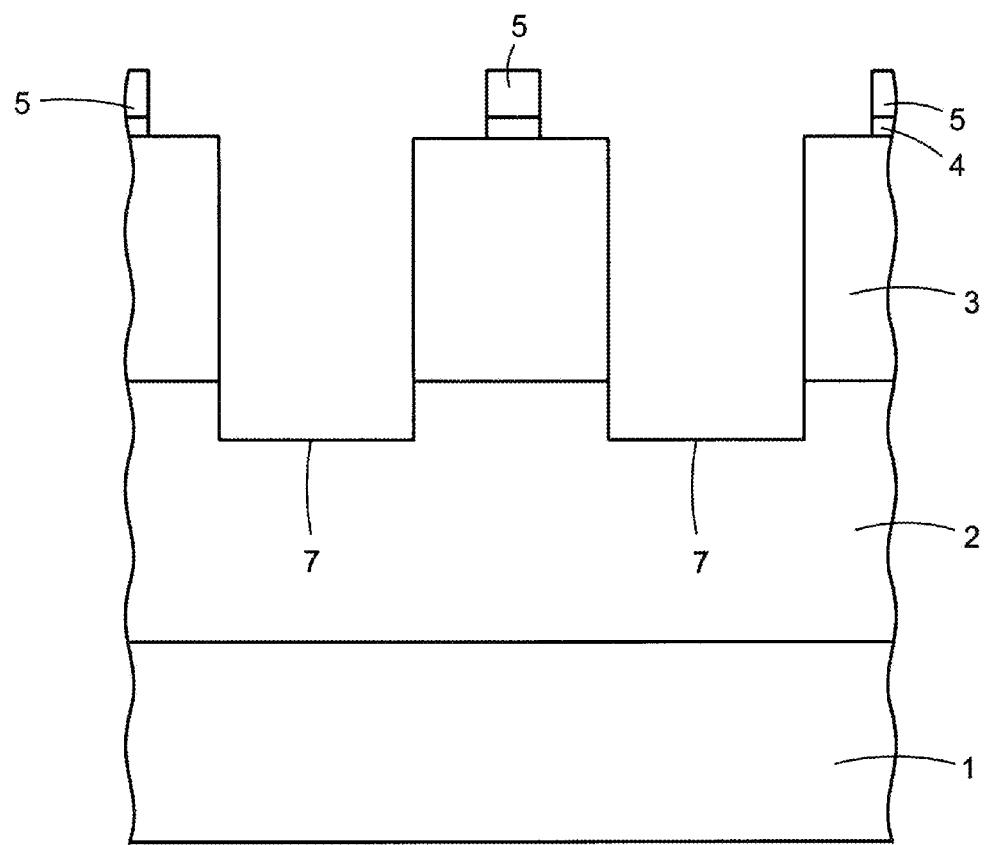
FIG. 6 is a cross-sectional view of a MOS-driven semiconductor device, depicting a manufacturing method according to the second embodiment of the present invention.
Figure 7:
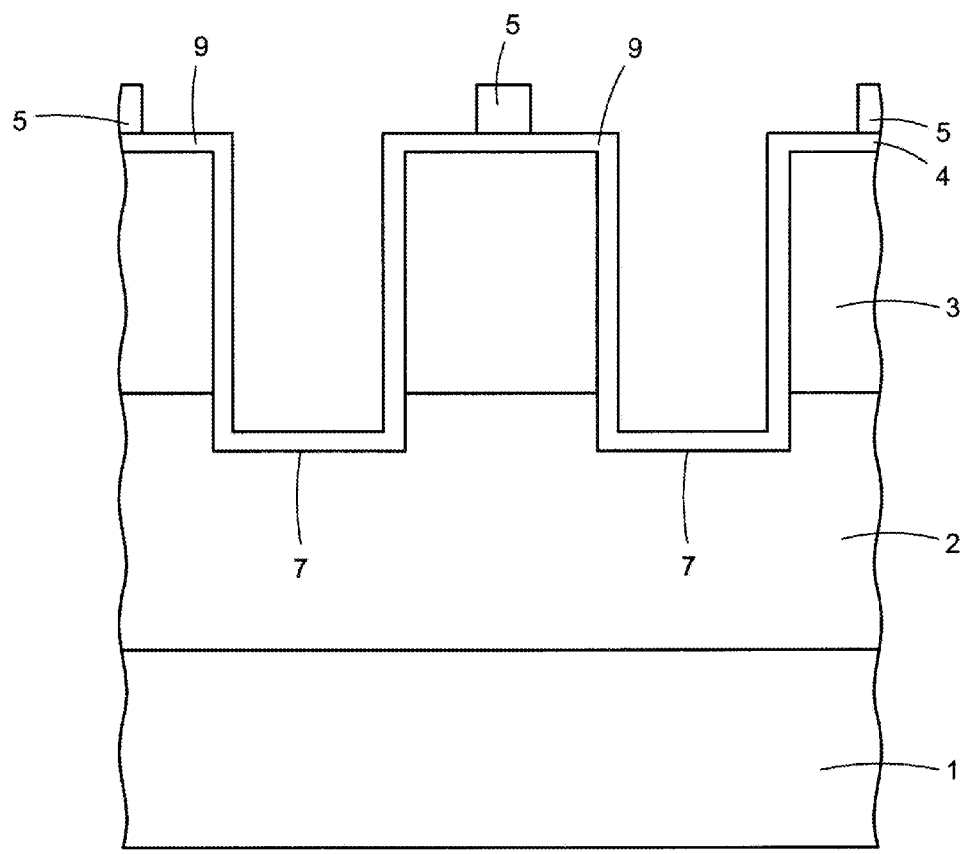
FIG. 7 is a cross-sectional view of a MOS-driven semiconductor device, depicting a manufacturing method according to the second embodiment of the present invention.
Figure 8:
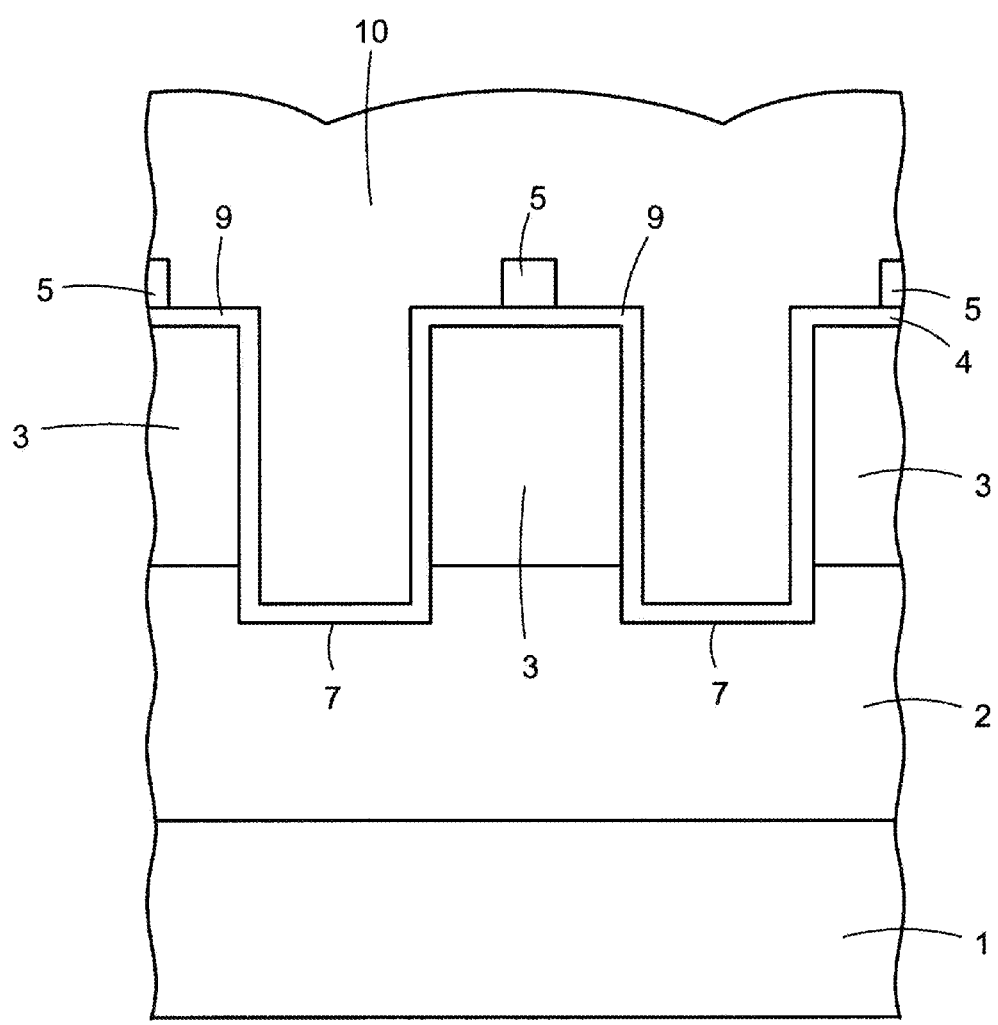
FIG. 8 is a cross-sectional view of a MOS-driven semiconductor device, depicting a manufacturing method according to the second embodiment of the present invention.

The photo-resist 6 used to form the trenches 7 is removed and the nitride film 5 is exposed. A sacrificial oxide film 8 is formed over the entire surface of the $n^-$ epi layer 2 including the trench bottom portions 7a and trench side walls 7b. Thereby, a damaged layer produced during the formation of the trenches 7 is removed (FIG. 5). Thereafter, the sacrificial oxide film 8 is removed (FIG. 6). At this time, the buffer oxide film 4 that is exposed at the surface of the substrate is also removed together with the sacrificial oxide film 8, and the buffer oxide film 4 remains only beneath the nitride film 5. A gate insulating film (gate oxide film) 9 is formed over the entire surface of the $n^-$ epi layer 2 including the trench bottom portions 7a and the trench side walls 7b (FIG. 7). A doped poly-silicon 10 is deposited such that the inside of each of the trenches 7 is completely filled (FIG. 8).

Figure 9:
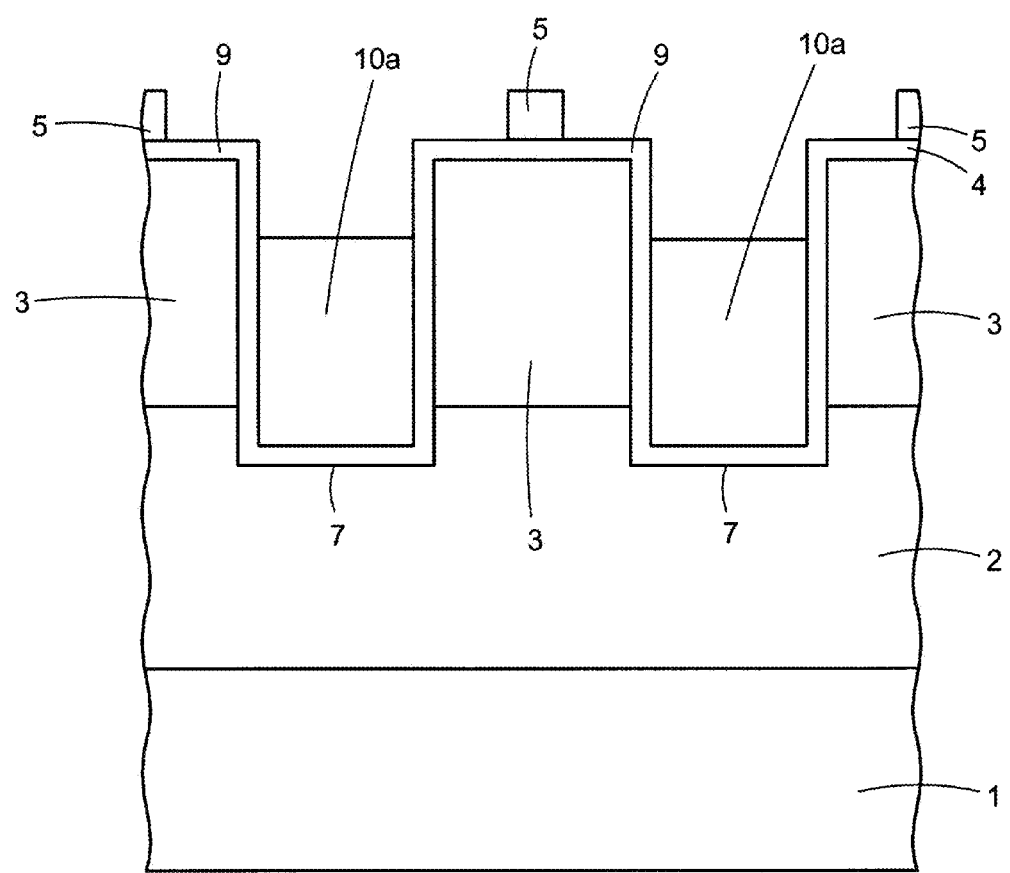
FIG. 9 is a cross-sectional view of a MOS-driven semiconductor device, depicting a manufacturing method according to the second embodiment of the present invention.

The doped poly-silicon 10 is deposited on the entire surface of the $n^-$ epi layer 2 that is formed thereon with the p-channel layer 3. An unnecessary portion of the doped poly-silicon 10 is removed by etching back and the remaining portions of the doped poly-silicon 10 are used as gate electrodes 10a. At this time, the etching back is executed until the surfaces of the gate electrodes 10a in the trenches 7 becomes deeper than the surface of the p-channel layer 3 by, for example, about 1 micrometer (FIG. 9). The surfaces of the gate electrodes 10a are used as a mask for forming the $n^+$ source layers 11 at a later process. Therefore, the etching back is executed such that the surfaces of the gate electrodes 10a are positioned to be shallower than the diffusion depth of the p-channel layer 3.

Figure 10:
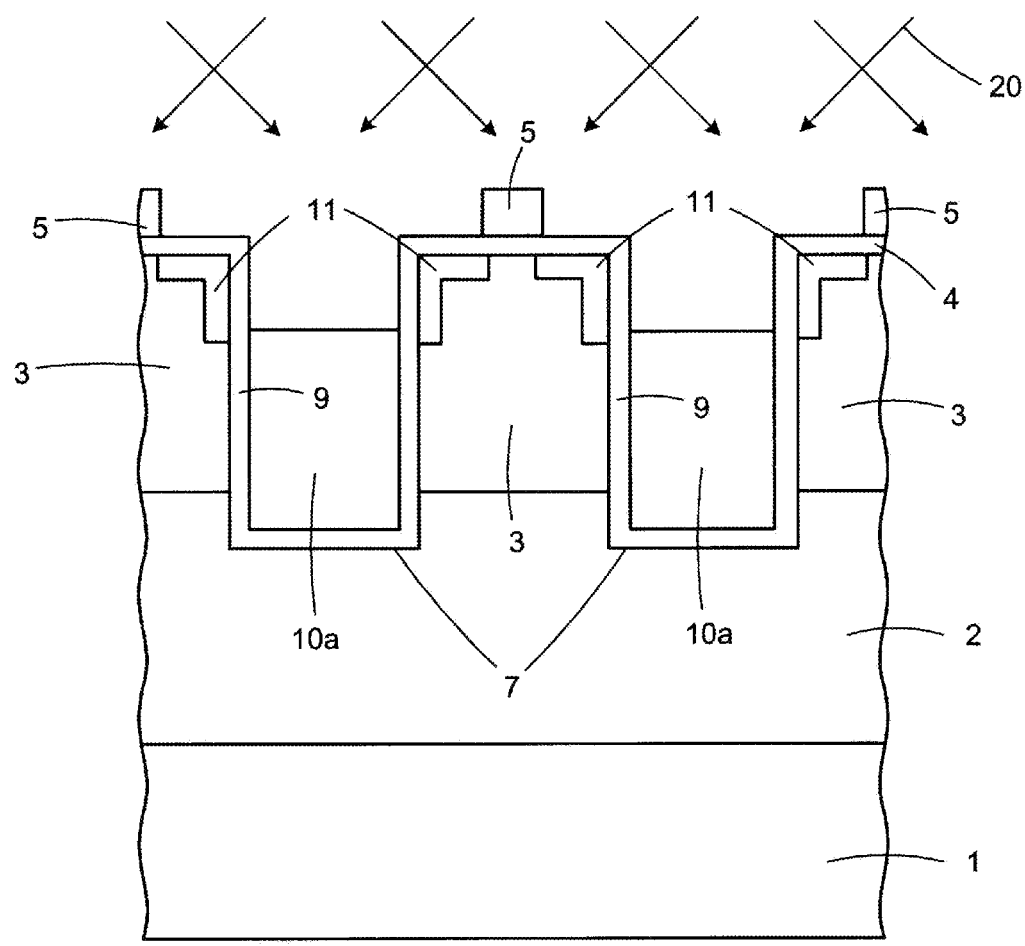
FIG. 10 is a cross-sectional view of a MOS-driven semiconductor device, depicting a manufacturing method according to the second embodiment of the present invention.

An impurity ion such as, for example, arsenic (As) is ion-implanted 20 in an oblique direction using these gate electrodes 10a and the nitride film 5 formed at the process depicted in FIG. 3, as a mask. This mask corresponds to a second mask. In this case, the ion implantation 20 may be executed at an accelerating voltage of about 80 KeV and with a dose of about $*3*10^{15}/cm^2$. The incidence angle of the oblique implantation of the ion implantation 20 may be 7 degrees or 40 degrees (FIG. 10). This incidence angle is an angle relative to a direction that is perpendicular to the silicon face. The ion implantation 20 is not limited to being obliquely executed and may be executed in a direction that is perpendicular to the silicon face. Because the $n^+$ source layers 11 are formed using the gate electrodes 10a as a mask, the side face of each of the gate electrodes 10a assuredly overlap a side face of each of the $n^+$ source layers 11. Thereby, a channel that is a path for electron to pass through may be formed in the p-channel layer 3 that is adjacent to the gate electrodes 10a across the gate insulating film 9. The width of the nitride film 5 is narrower than each trench interval A and therefore, the ion implantation 20 is also executed from the surface of the p-channel layer 3. Thereby, the $n^+$ source layers 11 are each formed in an L-shape.

Figure 11:
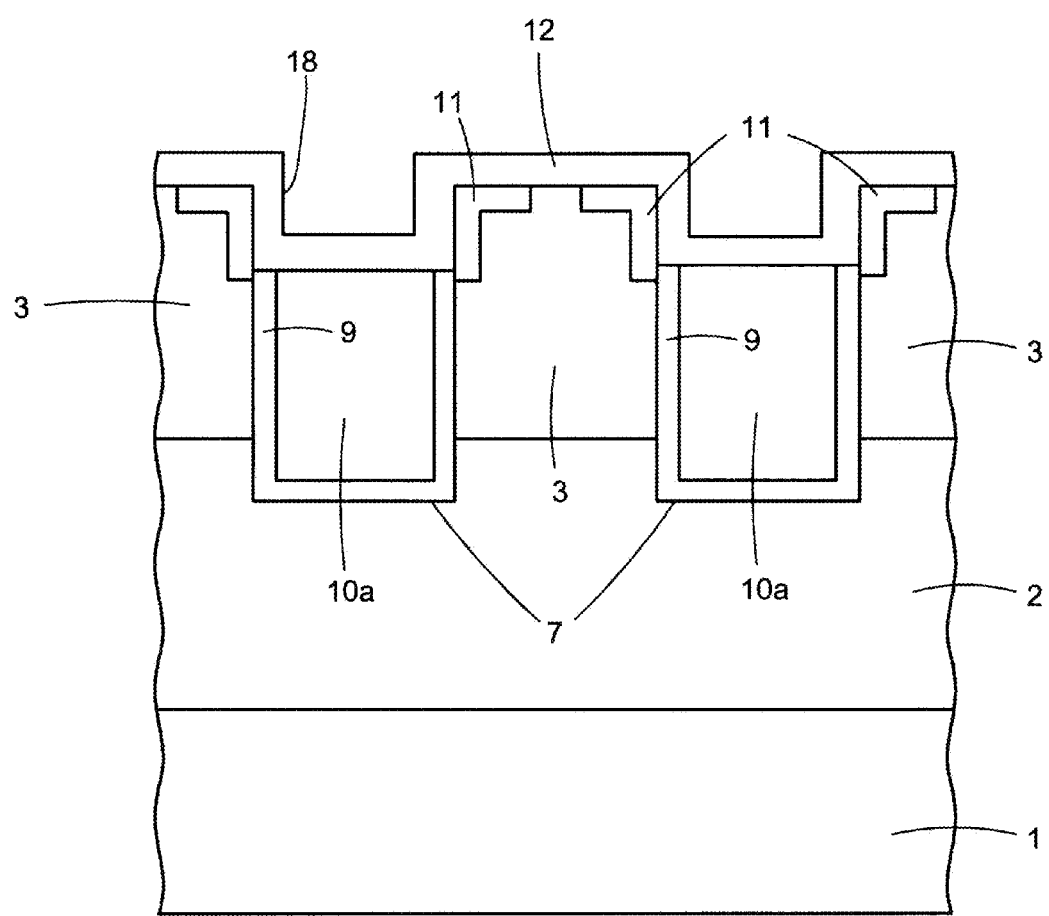
FIG. 11 is a cross-sectional view of a MOS-driven semiconductor device, depicting a manufacturing method according to the second embodiment of the present invention.

The nitride film 5 is removed. A CVD oxide film 12 is deposited to be 0.1 micrometer or more and 0.3 micrometer or less thick (FIG. 11). In this deposition of the CVD oxide film 12, the CVD oxide film 12 is deposited such that a recess 18 remains at an upper portion of each of the trenches 7. For example, the depth from the upper end of each of the trenches 7 to the surface of each of the gate electrodes 10a before the deposition of the CVD oxide film 12 is about 1 micrometer. Therefore, even when the CVD oxide film 12 is deposited to be 0.1 micrometer to 0.3 micrometer thick, the recesses 18 remain on the CVD oxide films 12 in the trenches 7. Preferably, the CVD oxide film 12 is an oxide film that is made of an LP-TEOS film or an HTO film, and is formed using a thermal CVD method. The reason for this is as follows. For a plasma oxide film, charge is present in the film and adversely affects the reliability of the film such as variation of the threshold voltage. In contrast, for LT-TEOS film or HTO film, the amount of charge in the film is small compared to that of a plasma oxide film and therefore, the affect on the reliability of the film such as variation of the threshold voltage is not problematic. The temperature may be set to be at 700 degrees C. or higher and lower than 850 degrees C. and the time for the formation may be several 10 minutes, as formation conditions for depositing an LP-TEOS film or an HTO film. When the CVD oxide film 12 is deposited under these conditions, the diffusion profile of each of the $n^+$ source layers 11 is not significantly affected. The formation of the LP-TEOS film is executed under a reduced pressure of several 10 Torr.

Figure 12:
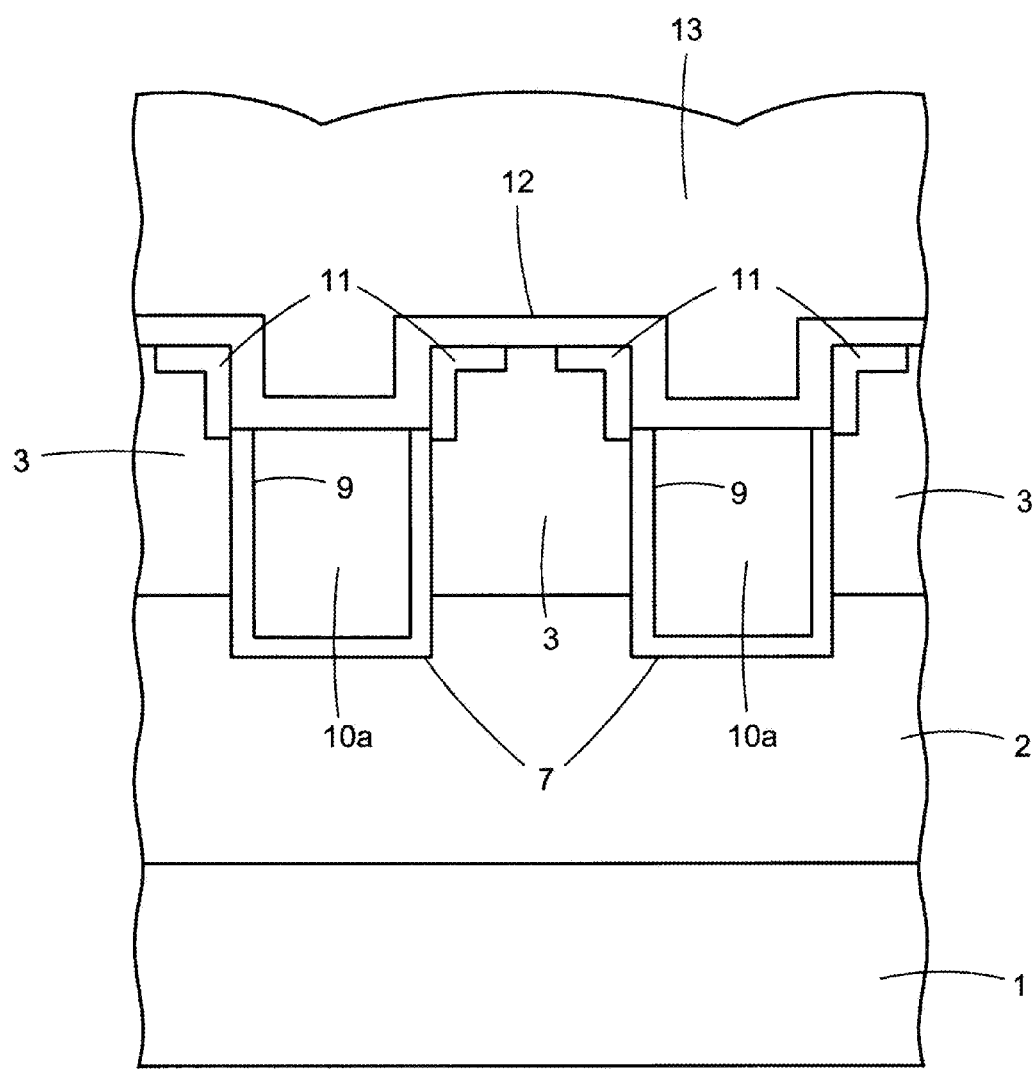
FIG. 12 is a cross-sectional view of a MOS-driven semiconductor device, depicting a manufacturing method according to the second embodiment of the present invention.

A non-doped poly-silicon layer 13 that is not doped with any impurity source is deposited and the recesses 18 are filled (FIG. 12). The reason a doped poly-silicon layer that is formed being doped with an impurity source is not deposited but rather the non-doped poly-silicon layer is deposited, is that a doped poly-silicon layer introduces therein an impurity gas during the deposition and therefore, an impurity from the gas becomes movable charge and degradation of the reliability such as variation of a threshold voltage tends to occur.

Figure 13:
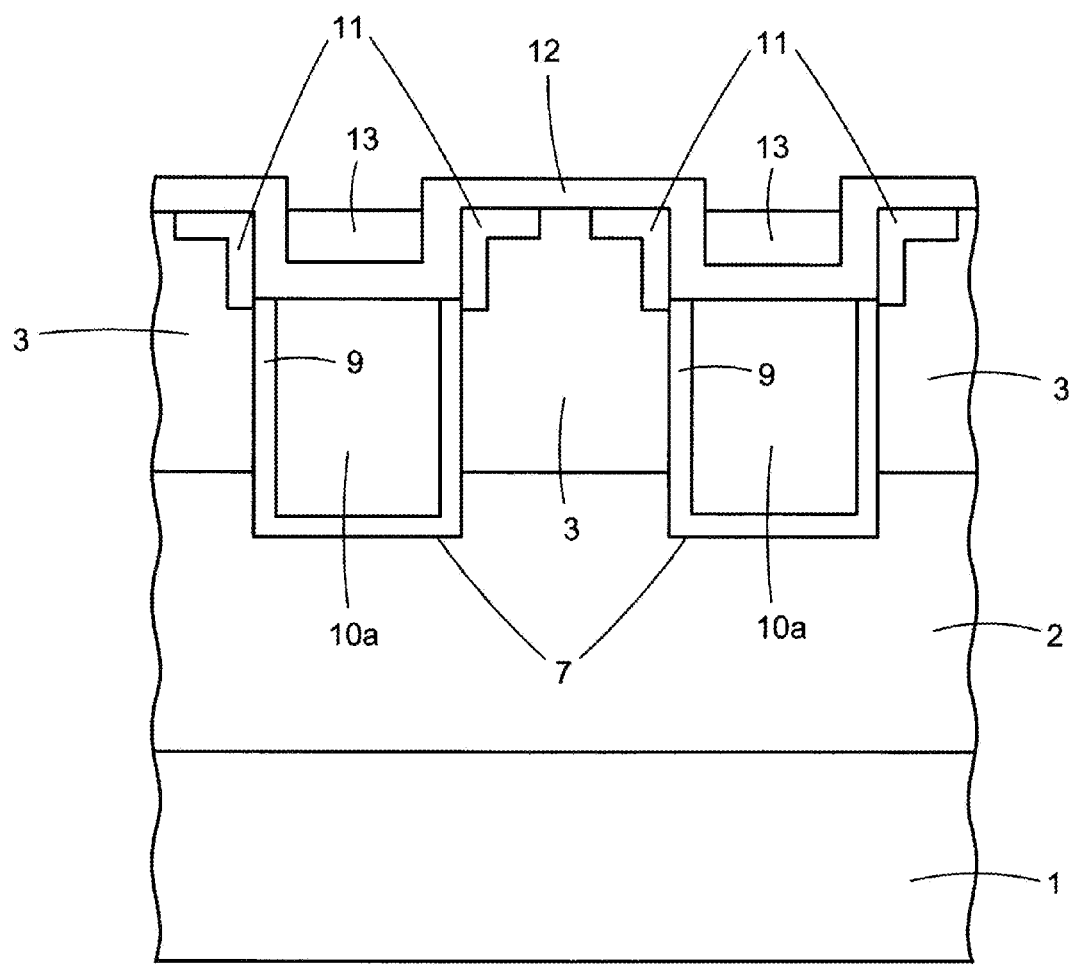
FIG. 13 is a cross-sectional view of a MOS-driven semiconductor device, depicting a manufacturing method according to the second embodiment of the present invention.
Figure 14:
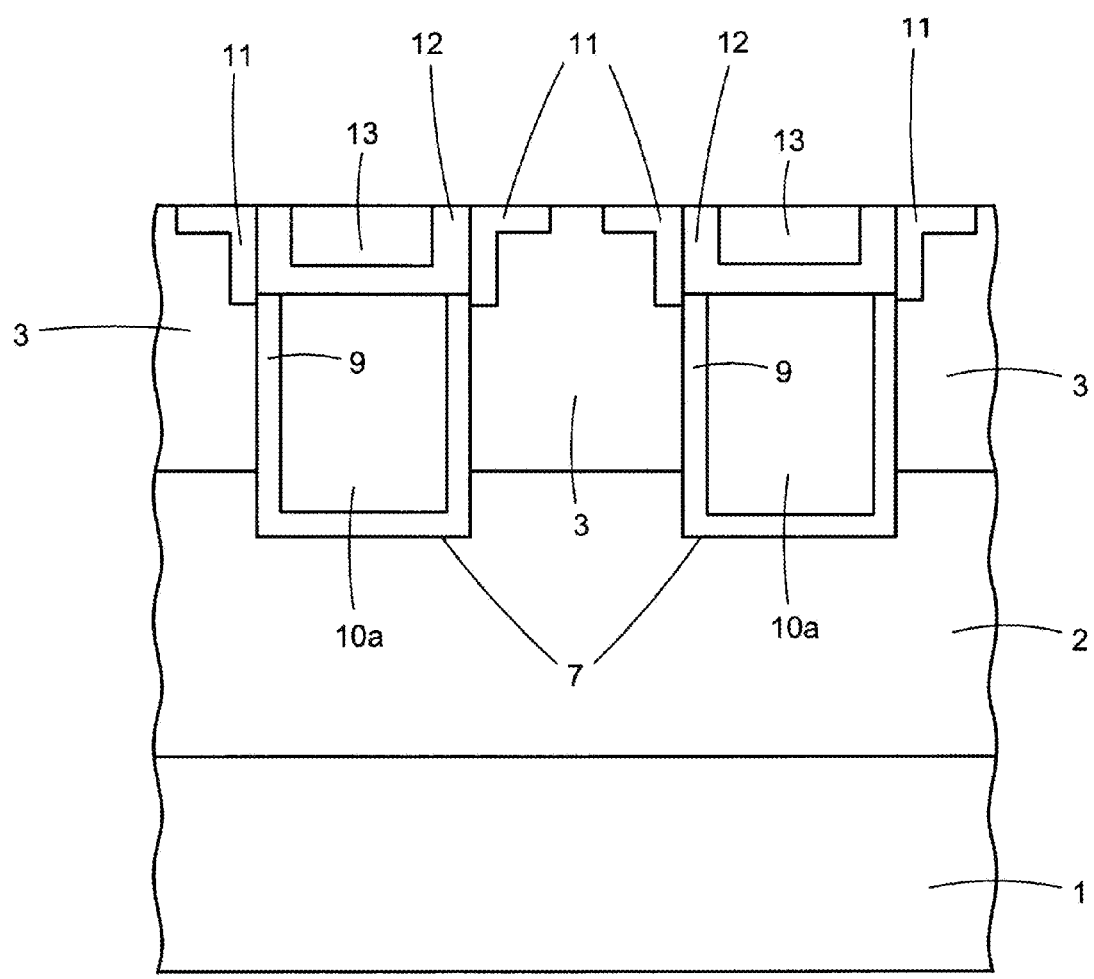
FIG. 14 is a cross-sectional view of a MOS-driven semiconductor device, depicting a manufacturing method according to the second embodiment of the present invention.

The non-doped poly-silicon layer 13 is etched back and the CVD oxide film 12 that is formed at the surface of the p-channel layer 3 is exposed (FIG. 13). The non-doped poly-silicon layer 13 only remains in the recesses 18. No heat treatment to oxidize the non-doped poly-silicon layer 13 is executed. The CVD oxide film 12 that is exposed is etched back. The surface of the non-doped poly-silicon layer 13 is further etched to planarize the surface of the semiconductor substrate (FIG. 14).

To form a $p^+$ contact layer 14 on the surface of the p-channel layer 3, an impurity ion such as, for example, boron (B) is ion-implanted into the surface of the semiconductor substrate. The $p^+$ contact layer 14 is formed to have an impurity concentration that is higher than that of the p-channel layer 3 and that is lower than that of the $n^+$ source layers 11. The accelerating voltage of the ion implantation may be about 50 KeV and the dose thereof may be about $2*10^{14}/cm^2$. Alternatively, boron fluoride (BF2) ion may be implanted at an accelerating voltage of about 50 keV and with a dose of about $1*10^{15}/cm^2$. Due to this ion implantation, ion is also implanted into areas of the $n^+$ source layers 11 to form the $p^+$ contact layer 14. However, the total amount of the impurity in the $n^+$ source layers 11 is greater compared to the amount of p-type impurity ion implanted thereinto and therefore, the resistance of the $n^+$ source layer 11 is not increased. Due to this ion implantation, ion to form the $p^+$ contact layer 14 is also implanted into the non-doped poly-silicon layer 13. However, differing from the areas in the surface of the semiconductor substrate such as the $n^+$ source layers 11, ion is implanted only into a shallow area having a depth of, for example, 0.15 micrometer or less of the surface layer.

Figure 15:
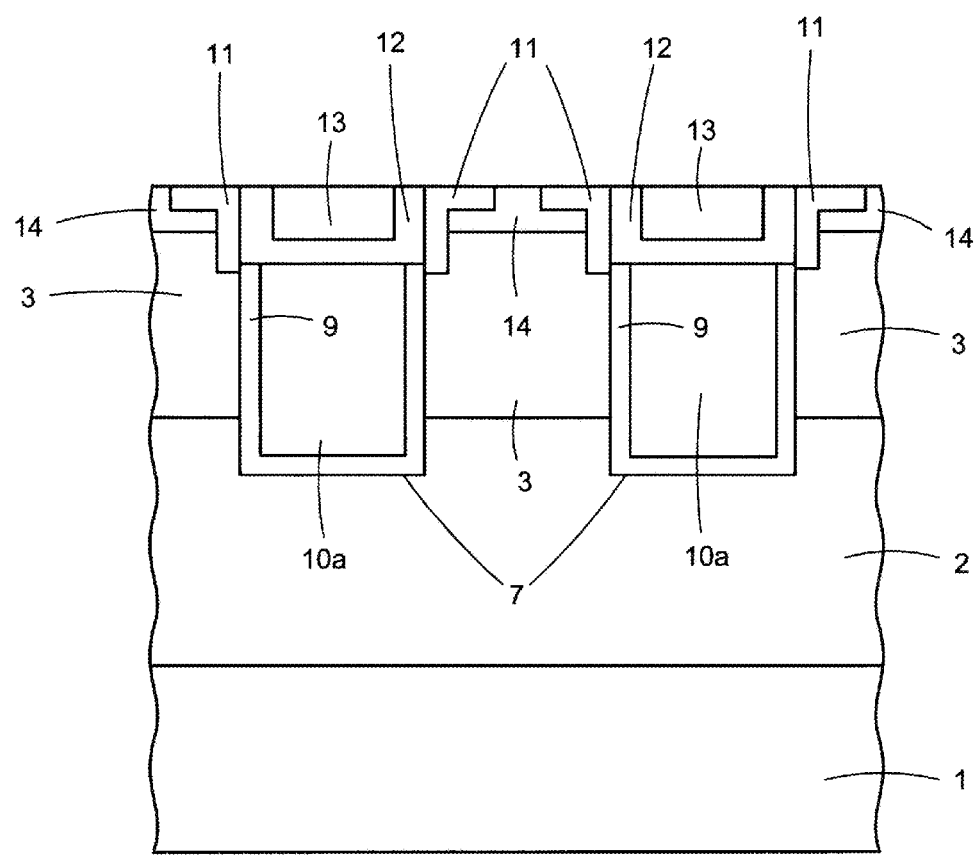
FIG. 15 is a cross-sectional view of a MOS-driven semiconductor device, depicting a manufacturing method according to the second embodiment of the present invention.

The ion that is implanted by the ion implantation is activated. The activation of the ion is executed by lamp annealing for several minutes at a heat treatment temperature of 900 degrees C. in a nitrogen gas ($N_2$) atmosphere. The arsenic ion in the $n^+$ source layers 11 is also simultaneously activated by this annealing. The ion that is ion-implanted into the surface layer of the non-doped poly-silicon layer 13 is also activated by this annealing (FIG. 15).

The impurity source is doped into the surface layer of the non-doped poly-silicon layer 13 by this annealing. However, after depositing the non-doped poly-silicon layer 13, the impurity doped into the surface layer thereof becomes fixed charge. Therefore, the probability that movable ion is generated in an interlayer insulating film is very low compared to that of the doped poly-silicon. Even when ion implantation to form the $p^+$ contact layer 14 is executed for the entire non-doped poly-silicon layer 13, movable ion is hardly generated. As a result, even in a case where an impurity source is doped in the non-doped poly-silicon layer 13 that is not doped with any impurity source when deposited, after the deposition thereof, adverse effects on the reliability of the non-doped poly-silicon layer 13 such as variation of the threshold value are slight. In processes thereafter, no annealing process in an oxidizing atmosphere is executed and therefore, the non-doped poly-silicon layer 13 is not oxidized. No annealing at 850 degrees C. or higher is executed in processes after this lamp annealing.

A source electrode 15 is formed on the surface of the p-channel layer 3. A drain electrode 16 is formed on the back face of the $n^+$ semiconductor substrate 1 after a back-wrapping process (FIG. 1). A protective film not depicted is deposited on a source pad area not depicted and the surface of the $n^-$ epi layer 2 excluding gate pad areas and thereby, the power MOSFET depicted in FIG. 1 is completed.

(Third Embodiment)

Figure 16:
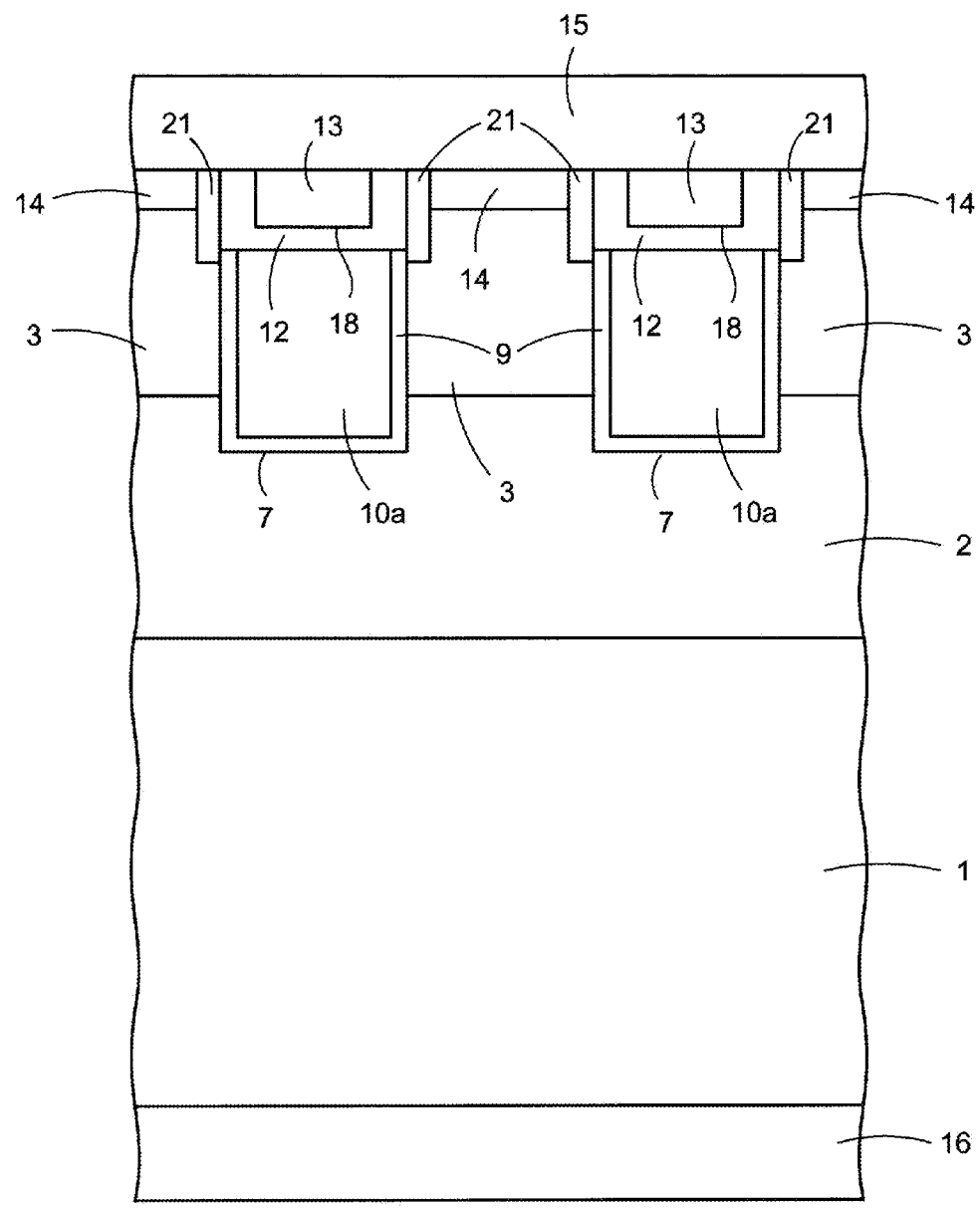
FIG. 16 is a cross-sectional view of components of a MOS-driven semiconductor device according to a third embodiment of the present invention.
Figure 17:
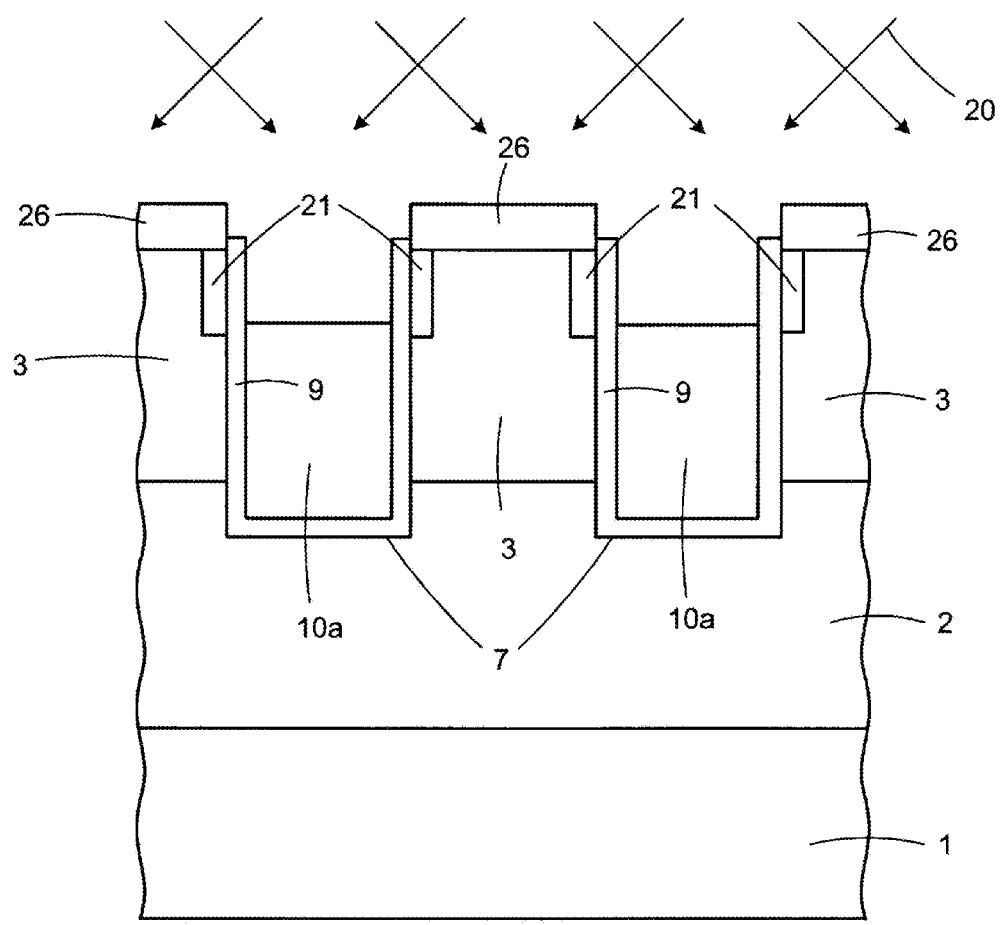
FIG. 17 is a cross-sectional view of the MOS-driven semiconductor device, depicting a manufacturing method according to the third embodiment of the present invention.

FIG. 16 is a cross-sectional view of components of a MOS-driven semiconductor device according to a third embodiment. FIG. 17 is a cross-sectional view of the MOS-driven semiconductor device, depicting a manufacturing method according to the third embodiment of the present invention. In the first embodiment, the $n^+$ source layers 11 may be disposed only in the surface layers of side faces of the p-channel layer 3. In the second embodiment, the trenches 7 may be formed using a silicon oxide film 26 as a mask instead of the photo-resist 6 that is used as the first mask.

As depicted in FIG. 16, in the third embodiment, $n^+$ source layers 21 are disposed in the surface layer of the side faces of the p-channel layer 3 and each have an I-shape. The $p^+$ contact layers 14 are selectively disposed in the surface layer of the upper face of the p-channel layer 3 and are each in contact with the $n^+$ source layers 21. Other structures are same as those in the first embodiment (see FIG. 1).

A manufacturing method of the MOS-driven semiconductor device depicted in FIG. 16 will be described. The $n^-$ epi layer 2 and the p-channel layer 3 are first formed on the $n^+$ semiconductor substrate 1 similarly to the second embodiment (see FIGS. 1 and 2). As depicted in FIG. 17, a silicon oxide film 26 is formed instead of the photo-resist 6 (see FIG. 4) that is formed in the second embodiment. The trenches 7 are formed using the silicon oxide film 26 as a mask. In the third embodiment, the nitride film 5 is not formed. The silicon oxide film 26 corresponds to the first mask. Similarly to the second embodiment, after the damaged layer produced when the trenches 7 are formed is removed using the sacrificial oxide film 8, the sacrificial oxide film 8 is removed (see FIGS. 5 and 6). In this case, the silicon oxide film 26 is not removed. Similarly to the second embodiment, after the gate insulating film 9 is formed, the trenches 7 are filled with the doped poly-silicon 10 and the doped poly-silicon 10 is etched back to be the gate electrodes 10a (see FIGS. 7 to 9).

Arsenic (As) is ion-implanted using the silicon oxide film 26 and the gate electrodes 10a as a mask. In this ion implantation, the ion implantation is only executed for the side face of each of the trenches. At this time, ion implantation is executed using at least the gate electrodes 10a as a mask. The gate electrodes 10a correspond to the second mask. Thereafter, the silicon oxide film 26 is removed by wet etching and, similarly to the second embodiment, the CVD oxide film 12 is formed such that the recesses 18 remain (see FIG. 11).

Similarly to the second embodiment, the recesses 18 are filled with the non-doped poly-silicon layer 13. Similarly to the second embodiment, the non-doped poly-silicon layer 13 and the CVD oxide film 12 are sequentially etched back. Thereafter, the non-doped poly-silicon layer 13 is etched and thereby, the surface of the semiconductor substrate is planarized (see FIGS. 12 to 14).

Similarly to the second embodiment, boron fluoride ($BF_2$) is ion-implanted into the entire surface of the p-channel layer 3 that includes the CVD oxide film 12 and the non-doped poly-silicon layer 13 and annealing is executed. Thereby, arsenic and boron that are ion-implanted are activated and $n^+$ source layers 21 and the $p^+$ contact layer 14 are formed (FIG. 15). The source electrode 15 is formed on the surface of the p-channel layer 3, and the drain electrode 16 is formed on the back side of the $n^+$ semiconductor substrate 1 after a back-wrapping process. Thereby, the power MOSFET depicted in FIG. 16 is completed.

Other manufacturing methods are same as that of the second embodiment. The above manufacturing method is a manufacturing method obtained by partially changing the second embodiment, and the same processes as those of the second embodiment may be executed similarly to those of the second embodiment.

As described, even when the ion implantation to form the $n^+$ source layer 21 is only executed for each trench side wall, the recesses 18 are formed on the gate electrodes 10a and the non-doped poly-silicon layer 13 is formed to fill the recesses 18. In addition, the non-doped poly-silicon layer 13 is not oxidized. Thereby, the profile of each of the diffusion layers, such as the $n^+$ source layer 21, is not varied. By filling the recesses 18 of the trenches 7 with the non-doped poly-silicon layer 13, generation of a void in the source electrode 15 can be prevented.

(Fourth Embodiment)

Figure 18:
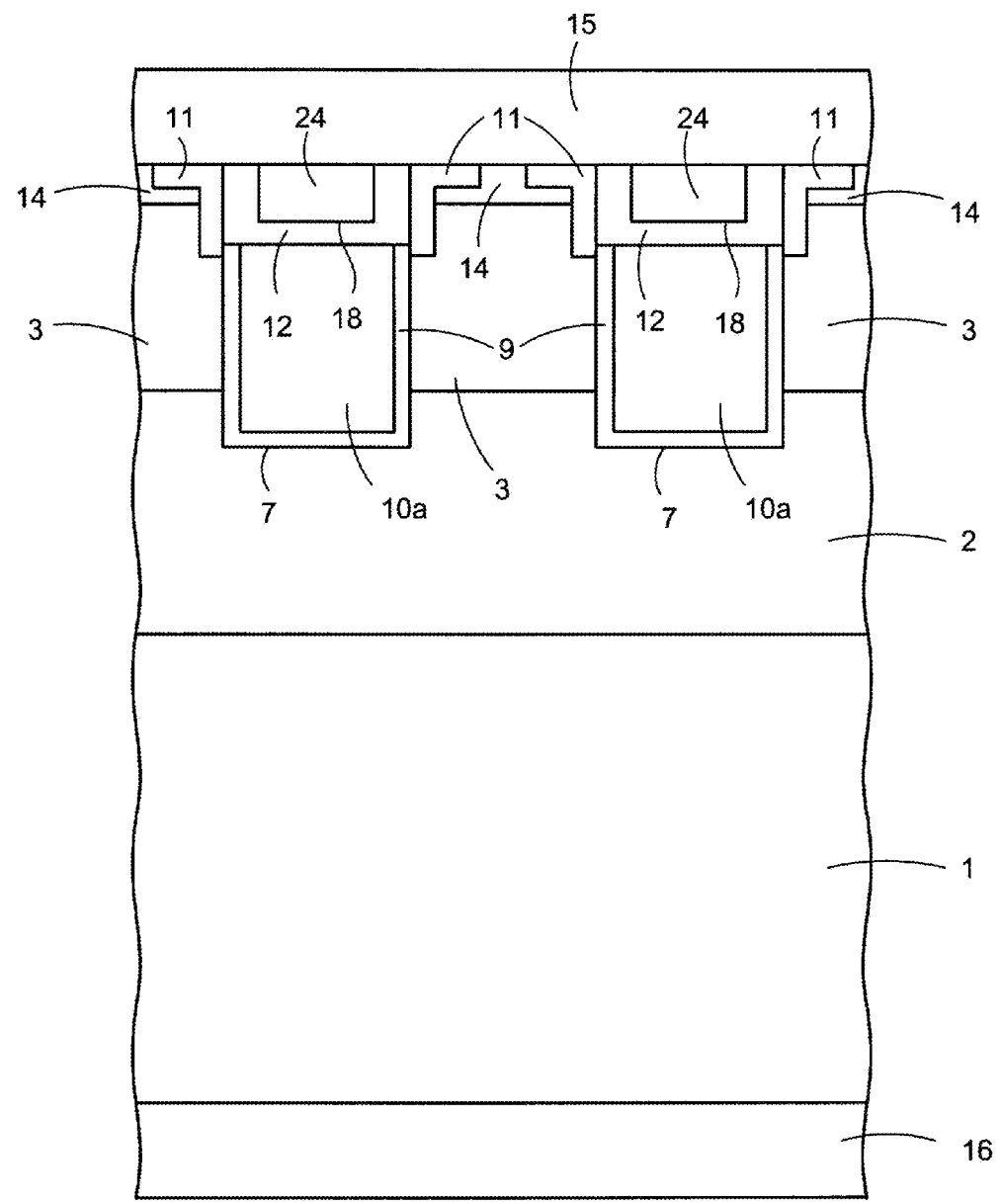
FIG. 18 is a cross-sectional view of components of a MOS-driven semiconductor device according to a fourth embodiment of the present invention.
Figure 19:
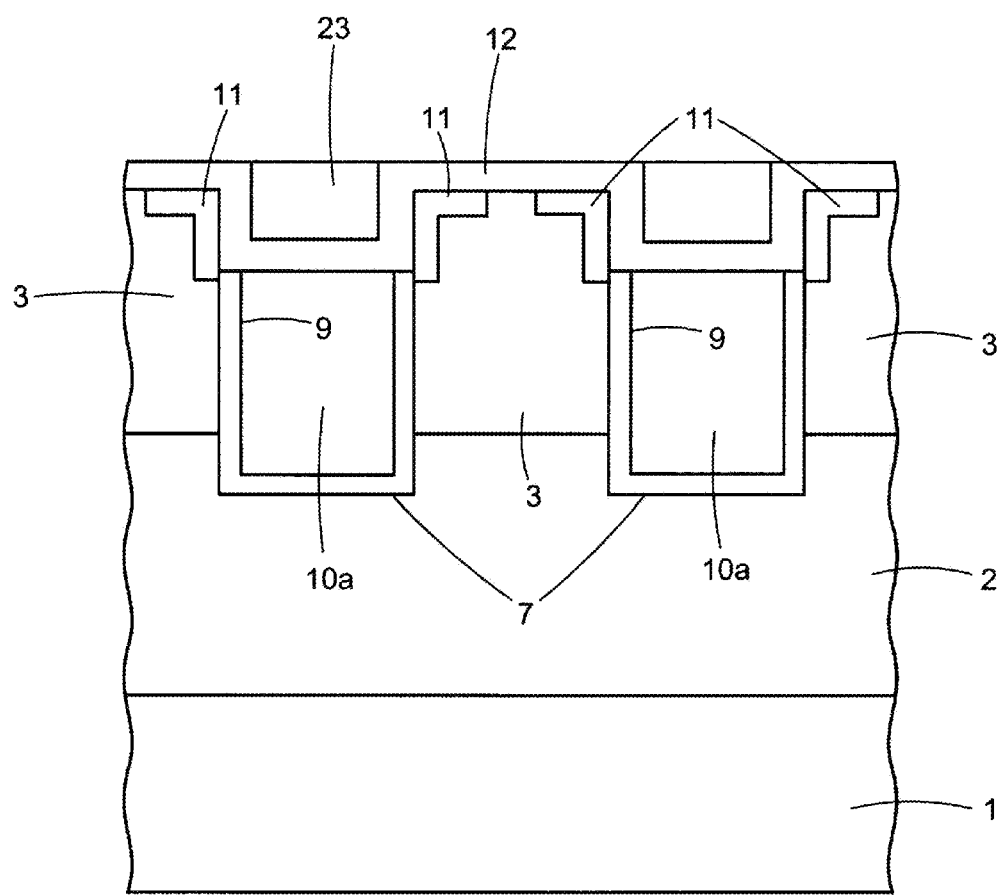
FIG. 19 is a cross-sectional view of the MOS-driven semiconductor device, depicting a manufacturing method according to the fourth embodiment of the present invention.
Figure 20:
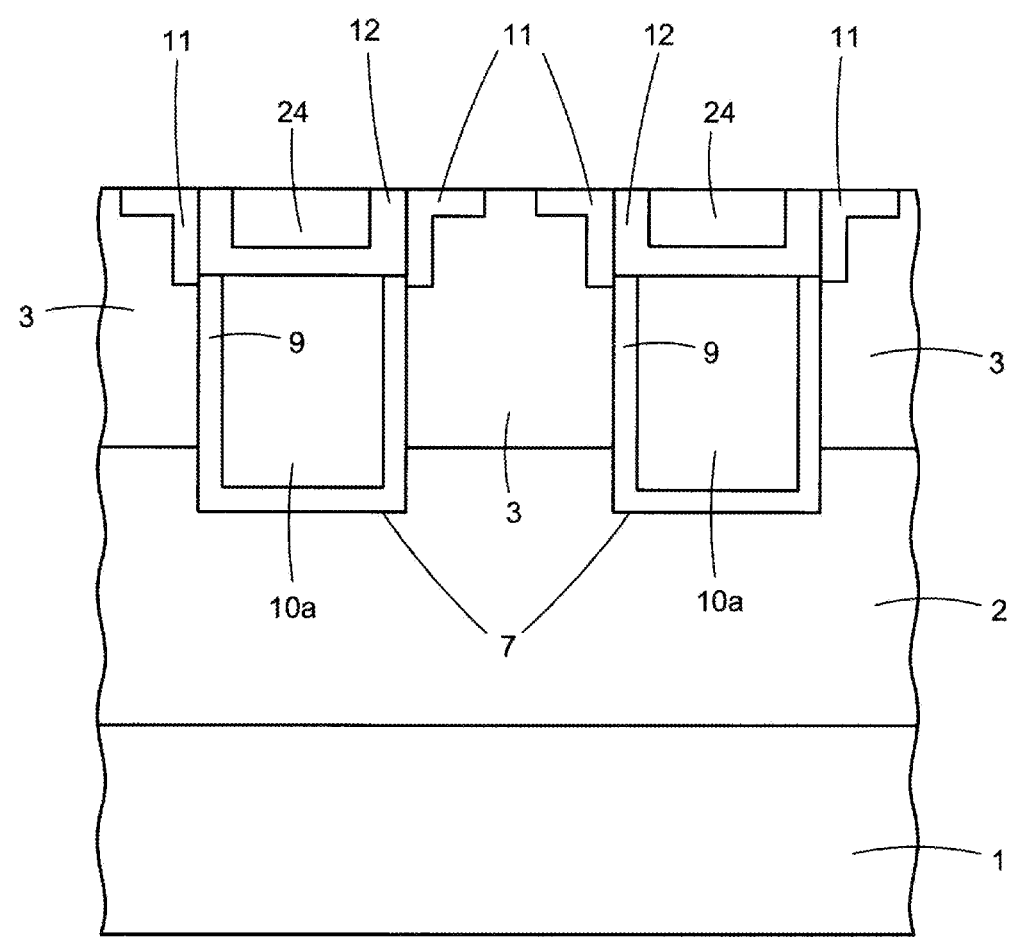
FIG. 20 is a cross-sectional view of the MOS-driven semiconductor device, depicting a manufacturing method according to the fourth embodiment of the present invention.
Figure 21:
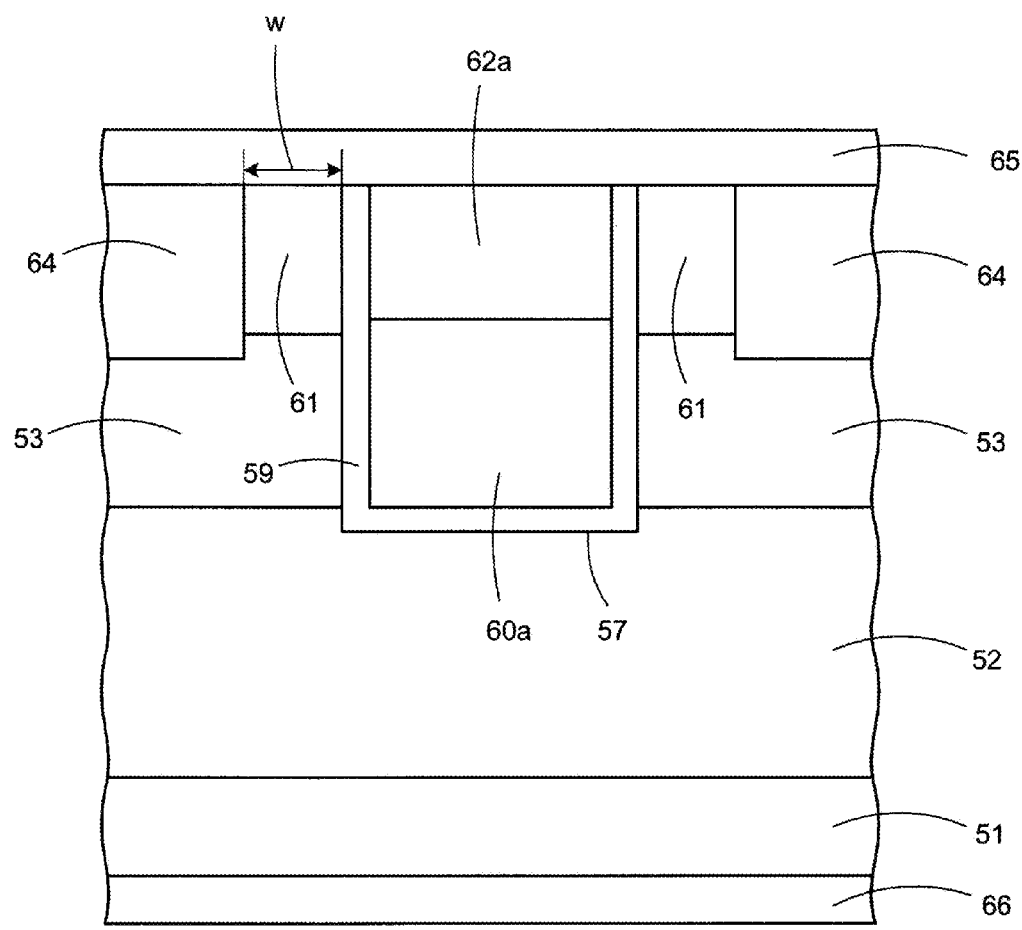
FIG. 21 is a cross-sectional view of components of a conventional power MOSFET.
Figure 22:
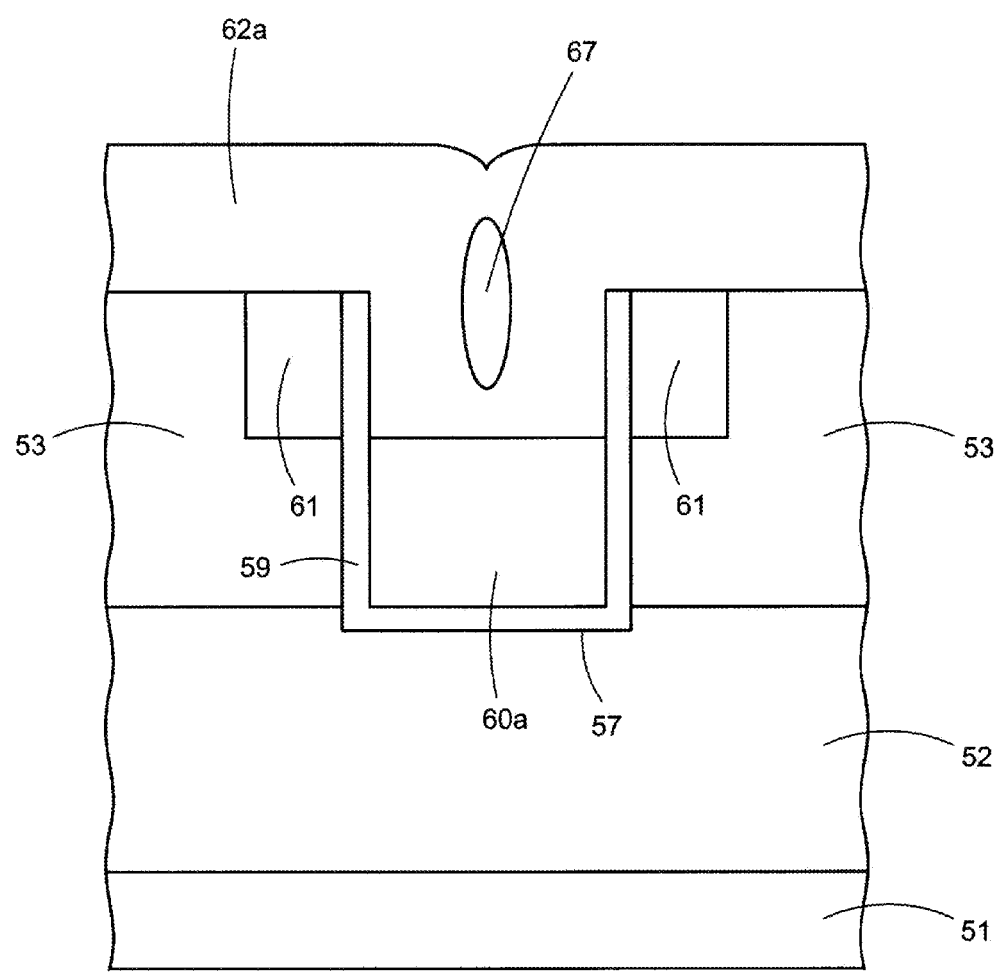
FIG. 22 is a cross-sectional view of a void generated in an interlayer insulating film.

FIG. 18 is a cross-sectional view of components of a MOS-driven semiconductor device according to a fourth embodiment of the present invention. FIGS. 19 and 20 are cross-sectional views of the MOS-driven semiconductor device, depicting a manufacturing method according to the fourth embodiment of the present invention. In the first embodiment, an insulating layer 24 that is formed by oxidizing a non-doped poly-silicon layer may be formed instead of the non-doped poly-silicon layer 13 that is not oxidized. In the second embodiment, the insulating layer 24 may be formed by depositing a non-doped poly-silicon layer as a filler 23 on the CVD oxide film 12 and oxidizing the non-doped poly-silicon layer instead of the process of forming the non-doped poly-silicon layer 13 on the CVD oxide film 12.

In the fourth embodiment, as depicted in FIG. 18, the inside of each of the recesses is filled with the insulating layer 24. Other structures are same as those in the first embodiment (see FIG. 1).

A manufacturing method of such a MOS-driven semiconductor device will be described. Similarly to the second embodiment, the $n^-$ epi layer 2, the p-channel layer 3, the trenches 7, the gate insulating films 9, the gate electrodes 10a, the $n^+$ source layers 11, the CVD oxide films 12, the recesses 18, and a non-doped poly-silicon layer are formed on the $n^+$ semiconductor substrate 1 (see FIGS. 2 to 12). In this case, the non-doped poly-silicon layer is the fillers 23 that fill the recesses 18.

As depicted in FIG. 19, the fillers 23 and the CVD oxide film 12 are etched back similarly to that of the second embodiment and thereby, the surface of the semiconductor substrate is planarized. Thereafter, as depicted in FIG. 20, the fillers 23 are oxidized to be the insulating layer 24. In this case, the fillers 23 are polished by chemical mechanical polishing (CMP) using the CVD oxide film 12 as a stopper. The insulating layers 24 are formed by oxidizing the fillers 23. The surface of the semiconductor substrate is planarized by etching back the insulating layers 24 and the CVD oxide film 12. Processes to be executed thereafter are executed similarly to those of the second embodiment and thereby, the power MOSFET depicted in FIG. 18 is completed.

Other manufacturing methods are same as the second embodiment. The above manufacturing method is a manufacturing method obtained by partially changing the second embodiment and the processes that are same as those of the second embodiment may be executed similarly to those of the second embodiment.

In the fourth embodiment, the $n^+$ source layers 11 are formed using the nitride film 5 as a mask and thereby, the $n^+$ source layers 11 may be formed assuredly on the planar surface of the p-channel layer 3. As a result, the $n^+$ source layers 11 may be brought into stable electrical contact with the source electrode 15. In a power-MOSFET that employs fine cells whose trench intervals A each are 0.8 micrometer or less, the $n^+$ source layers 11 and the source electrode 15 may be assuredly in electrical contact with each other. A trench interval A that is less than 0.2 micrometer is currently the limit for manufacturing apparatuses and therefore, it is desirable that the trench interval A is 0.2 micrometer or wider.

In the fourth embodiment, a process of forming the non-doped poly-silicon layer as the fillers 23 and oxidizing the non-doped poly-silicon layer is added. Because the profile of each of the $n^+$ source layers 11 is varied due to this process, preferably, the MOSFET is designed taking into account in advance the effect of the variation. To eliminate the effect on the profile of each of the $n^+$ source layers 11, preferably, the relation between, for example, the lateral diffusion width of each of the $n^+$ source layers 11 and the trench interval A is understood before the design of the MOSFET.

As described, in the fourth embodiment, the process of oxidizing the non-doped poly-silicon layer is added compared to the first embodiment. Therefore, to oxidize the non-doped poly-silicon layer, design of the MOSFET that takes into account the influence on the profile is necessary. However, as described, the $n^+$ source layers 11 may be formed assuredly on the planar surface of the p-channel layer 3 similarly to the first embodiment. As a result, the $n^+$ source layers 11 can be brought into stable electrical contact with the source electrode 15.

EXAMPLE

Figure 23:
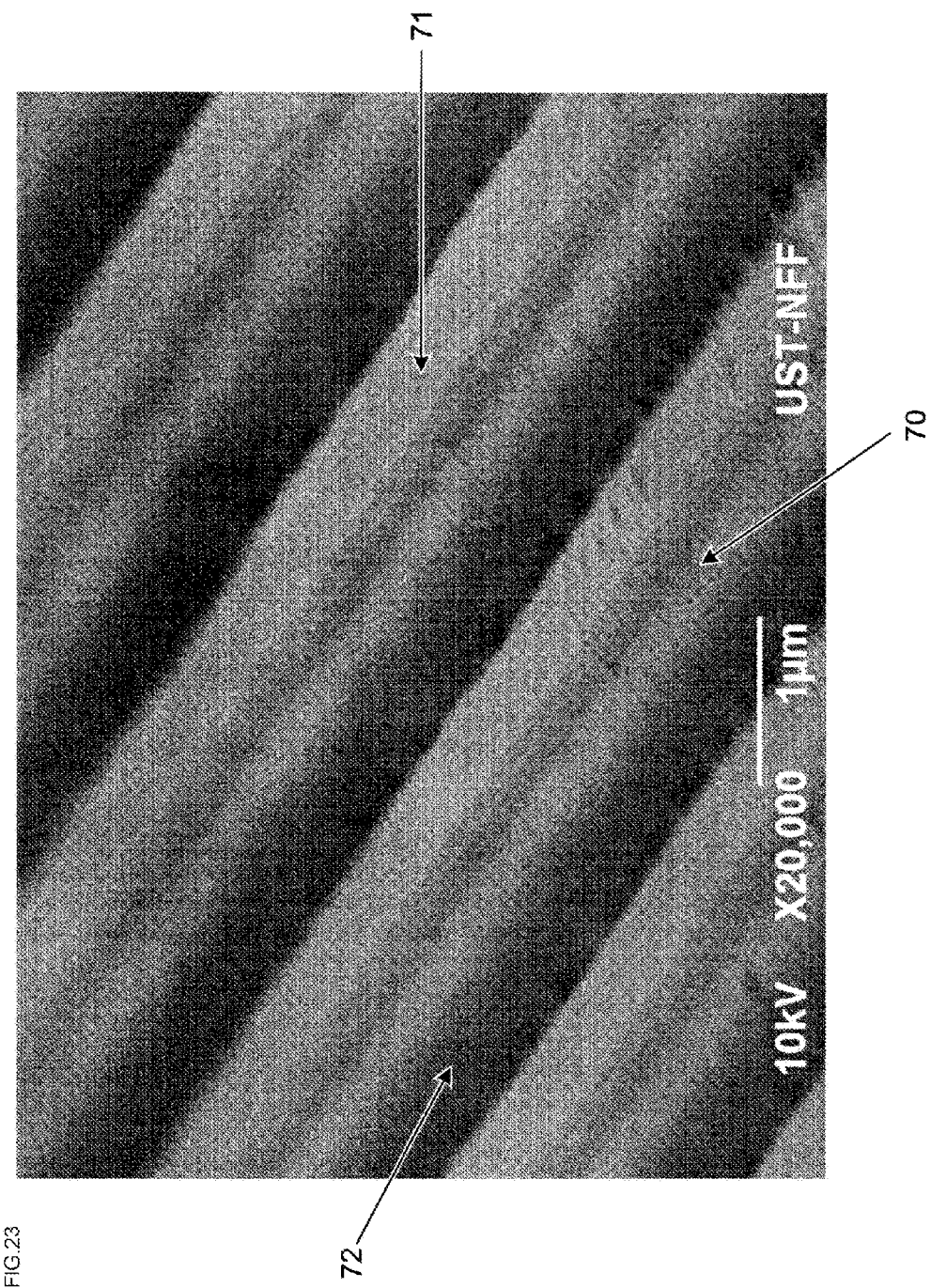
FIG. 23 is an electron microscope photograph of a silicon (Si) substrate viewed along a surface thereof.
Figure 24:
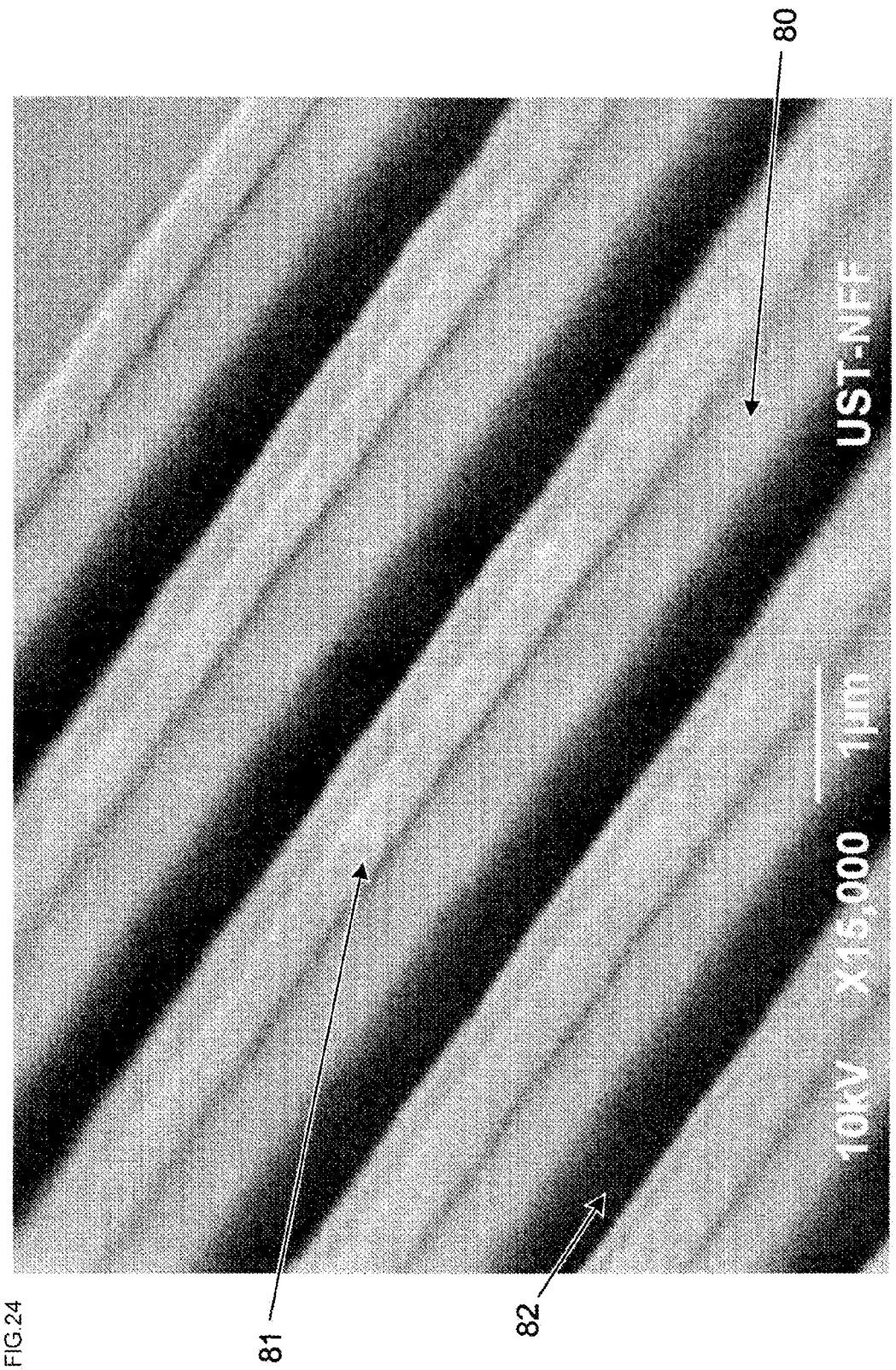
FIG. 24 is an electron microscope photograph of a silicon (Si) substrate viewed along a surface thereof.

The state of the nitride film that was formed as the mask to be used to form the $n^+$ source layers was observed. FIGS. 23 and 24 are electron microscope photographs of a silicon (Si) substrate viewed along a surface thereof. A scanning electron microscope (SEM) was used to observe the silicon substrate. On the silicon substrate 70 depicted in FIG. 23, trenches 72 were formed according to the above embodiments after a nitride film 71 was formed as a mask to be used to form the n⁺ source layers (hereinafter, "example"). The trench interval A was 0.8 micrometer. The mask pattern width was 0.5 micrometer. For comparison, on the silicon substrate 80 depicted in FIG. 24, trenches 82 were formed similarly to the example after a photo-resist 81 was formed as the mask to be used to form the n⁺ source layers (hereinafter, "comparative example"). In the comparative example, the photo-resist was a single layer of an organic material. An anti-reflection film that prevents the reflection of light from, for example, the silicon face was not formed. Other conditions were same as those of the example.

From the result depicted in FIG. 24, the side wall pattern of the photo-resist 81 running parallel to the trenches 82 was not a straight line in the comparative example that used the photo-resist 81. The pattern was drawn on a photo mask into a pattern having a constant mask pattern width. However, irregularity occurred to the mask pattern width after patterning due to an influence of halation. The influence of the halation became stronger and dispersion in the processing of the patterning became more conspicuous as the trench interval A became narrower.

In contrast, from the result depicted in FIG. 23, in the example that used the nitride film 71 as the mask, no irregularity occurred to the mask pattern width after the processing and the problem arising when the photo-resist was used as above could be solved. As described, when the trench interval A was 0.8 micrometer, it was found that occurrence of the irregularity to the mask pattern width of the nitride film 71 after the trenches were formed could be prevented. Similarly, even when the trench interval A was narrower than 0.8 micrometer, the nitride film 71 could be patterned.

As described, according to the first to the fourth embodiments, effects described in the following (1) to (3) are achieved. (1) The nitride film 5 having openings that correspond to areas to form the n⁺ source layers 11 is formed as a mask (to be used to form the n⁺ source layers 11 before the trenches 7 are formed. The width of the mask is set to be a width that is narrower than the interval between adjacent trenches 7 (trench interval A). The n⁺ source layers 11 are formed using, as a mask, the nitride film 5 and the gate electrodes 10a that are formed in the trenches 7. Thereby, the n⁺ source layers 11 may be formed assuredly on the planar surface of the p-channel layer 3. As a result, the n⁺ source layers 11 can be brought into stable electrical contact with the source electrode 15. The n⁺ source layers 11 and the source electrode 15 can be assuredly in electrical contact with each other even in a power MOSFET that employs fine cells whose trench interval A is narrower than 0.8 micrometer. It is desirable that the trench interval A is 0.2 micrometer or wider.

(2) The thickness of the CVD oxide film 12 is set to be 0.1 micrometer or more and 0.3 micrometer or less. The thickness of the CVD oxide film 12 that is immediately beneath the non-doped poly-silicon layer 13 is set to be 0.1 micrometer or more. Thereby, the breakdown voltage between the gate and the source is set to be 60 V. Therefore, the non-doped poly-silicon layer 13 does not need to be oxidized to secure the breakdown voltage. The breakdown voltage of the CVD oxide film 12 is at least 6 MV/cm and therefore, the breakdown voltage is 60 V when the film thickness is 0.1 micrometer or more. The rated voltage between the gate and the source of a device is at highest 20 V. Therefore, when a breakdown voltage of 60 V is secured, the gate and the source are not short-circuited therebetween by a surge voltage. By setting the thickness of the CVD oxide film 12 to be 0.3 micrometer or less, generation of a void in the CVD oxide film 12 can be suppressed.

(3) By not oxidizing the non-doped poly-silicon layer 13, the profile of each of the diffusion layers such as the n⁺ source layers 11 is not varied. By filling the recesses 18 of the trenches 7 with the non-doped poly-silicon layer 13, generation of a void in the source electrode 15 can be prevented.

The present invention has been described herein taking an example of the power MOSFET. However, the present invention may also be applied to a MOS-driven semiconductor device such as an insulated gate bipolar transistor (IGBT) obtained by replacing the n⁺ semiconductor substrate with a p⁺ semiconductor substrate and using the n⁺ source layers 11 as the n⁺ emitter layers in the embodiments. The MOS-driven semiconductor device may be a p-channel semiconductor apparatus whose conducting types are inversed to be the p and the n types respectively as the first and the second conducting types. The recesses are formed by the oxide film formed using the CVD method (CVD oxide film). However, not only the CVD oxide film but also an oxide film that is formed not to include any impurity may be used.

INDUSTRIAL APPLICABILITY

As described, the MOS-driven semiconductor device and the method for manufacturing the MOS-driven semiconductor device according to the present invention are suitable for a semiconductor apparatus that has a trench structure.

REFERENCE SIGNS LIST

1 n⁺ semiconductor substrate
2 n⁻ epi layer (n⁻ epitaxial layer)
3 p-channel layer
4 buffer oxide film
5 nitride film
6 photo-resist
7 trench
7a trench bottom portion
7b trench side wall
8 sacrificial oxide film
9 gate insulating film
10 doped poly silicon
10a gate electrode
11 n⁺ source layer
12 CVD oxide film
13 non-doped poly-silicon layer
14 p⁺ contact layer
15 source electrode
16 drain electrode
18 recess

The invention claimed is:
1. A MOS-driven semiconductor device comprising:
a channel layer of a second conducting type that is disposed on a surface layer of a first semiconductor layer of a first-conducting type, said first conducting type being different than said second conducting type;
a trench that passes through the channel layer to the first semiconductor layer;
a second semiconductor layer that is of the first conducting type, is in contact with a side wall of the trench, and selectively disposed in a surface layer of the channel layer;
a third semiconductor layer that is of the second conducting type, is disposed in the surface layer of the channel layer, and has an impurity concentration that is greater than that of the channel layer and less than that of the second semiconductor layer;

a gate insulating film that is disposed on an inner wall of the trench;

a gate electrode that is embedded in the trench which is lined with the gate insulating film, a height of a surface of the gate electrode being along a side face of the second semiconductor layer;

an oxide film that is disposed on the side wall of the trench and covers the surface of the gate electrode which faces the trench opening, the oxide film having a recess above the gate electrode, the oxide film being made of an LP-TEOS film or an HTO film, a thickness of the oxide film being 0.1 µm or more and 0.3 µm or less;

a non-doped poly-silicon layer that is embedded in the recess of the oxide film; and a main electrode that is in contact with the second semiconductor layer and the third semiconductor layer.

2. The MOS-driven semiconductor device according to claim 1, wherein a bottom of the non-doped poly-silicon layer is at a position that is closer to an exposed surface of the channel layer than a bottom of the second semiconductor layer.

3. The MOS-driven semiconductor device according to claim 1, wherein the oxide film covers the upper edge of the gate insulating film which faces the trench opening.

* * * * *